(12) United States Patent
Kim et al.

(10) Patent No.: US 11,550,438 B2
(45) Date of Patent: Jan. 10, 2023

(54) TOUCH DISPLAY DEVICE, A METHOD OF DRIVING THEREOF, TOUCH DRIVING CIRCUIT, AND TOUCH CONTROLLER USING A VARIABLE FREQUENCY TOUCH DRIVING SIGNAL DURING A TOUCH FRAME PERIOD

(71) Applicant: LG Display Co., Ltd., Seoul (KR)

(72) Inventors: Hyunwoo Kim, Seoul (KR); Jaehun Jun, Seoul (KR); Sojung Jung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/368,339

(22) Filed: Jul. 6, 2021

(65) Prior Publication Data

US 2022/0147185 A1    May 12, 2022

(30) Foreign Application Priority Data

Nov. 11, 2020  (KR) .......................... 10-2020-0150531

(51) Int. Cl.
*G06F 3/044* (2006.01)
*G06F 3/041* (2006.01)
*G06F 3/046* (2006.01)
*G06F 3/0354* (2013.01)

(52) U.S. Cl.
CPC ........ *G06F 3/0446* (2019.05); *G06F 3/03547* (2013.01); *G06F 3/046* (2013.01); *G06F 3/0412* (2013.01); *G06F 3/04166* (2019.05); *G06F 2203/04104* (2013.01)

(58) Field of Classification Search
CPC ............... G06F 3/0446; G06F 3/04166; G06F 3/03547; G06F 3/0412; G06F 3/046; G06F 2203/04104
See application file for complete search history.

(56) References Cited

U.S. PATENT DOCUMENTS

2017/0300165 A1* 10/2017 Shin .................... G06F 3/04184
2018/0088705 A1*  3/2018 Takahashi ............. G06F 3/0446

* cited by examiner

*Primary Examiner* — Lisa S Landis
(74) *Attorney, Agent, or Firm* — Fenwick & West LLP

(57) ABSTRACT

The present disclosure relates to a touch display device, a method of driving the touch display device, a touch driving circuit, and a touch controller, for sensing a touch using a touch driving signal whose frequency is changed in sync with a touch driving timing. According to the embodiments of the present disclosure, it is possible to have a high signal-to-noise ratio as well as improved immunity to the EMI, and acquire improved touch sensitivity.

20 Claims, 27 Drawing Sheets

TOUCH DISPLAY DEVICE, A METHOD OF DRIVING THEREOF, TOUCH DRIVING CIRCUIT, AND TOUCH CONTROLLER USING A VARIABLE FREQUENCY TOUCH DRIVING SIGNAL DURING A TOUCH FRAME PERIOD

CROSS-REFERENCE TO RELATED APPLICATION

This application claims the priority benefit of Republic of Korea Patent Application No. 10-2020-0150531, filed on Nov. 11, 2020 in the Korean Intellectual Property Office, the disclosure of which is incorporated herein by reference in its entirety.

BACKGROUND

Field of the Disclosure

The present disclosure relates to touch display devices, methods of driving the touch display devices, touch driving circuits, and touch controllers.

Description of the Background

As the advent of information society, there have been growing needs for display devices for displaying images. To meet such needs, various types of display devices, such as a liquid crystal display (LCD) device, an electroluminescence display (ELD) device including a quantum-dot light emitting display device, and an organic light emitting display (e.g., OLED) device, and the like, have been developed and widely used.

Among such display devices, by diversifying away from typical input devices, such as buttons, keyboards, mice, and the like, a touch display device enabling a touch-based input is increasingly popular as it allows users to input information or commands intuitively and conveniently.

However, conventional touch display devices suffer from a significant disadvantage of allowing touch sensitivity to be deteriorated due to electromagnetic interference (EMI) unexpectedly produced from such touch display devices. Recently, although various approaches for reducing or preventing the EMI have been considered, in turn, such approaches produce rather a side effect of causing signal-to-noise ratio (SNR) to be poor, which is a primary performance factor for touch sensitivity.

SUMMARY

Embodiments of the present disclosure provide touch display devices having improved immunity to the EMI.

Embodiments of the present disclosure provide touch display devices having a high SNR, as well as having improved immunity to the EMI.

Embodiments of the present disclosure provide touch display devices, method of driving the touch display devices, touch driving circuits, and touch controllers for sensing a touch using a touch driving signal whose frequency is changed in sync with a touch driving timing.

In accordance with embodiments of the present disclosure, a touch display device is provided that includes a plurality of touch electrodes, and a touch driving circuit for supplying a touch driving signal whose frequency is changed over time to at least one of the plurality of touch electrodes.

In the touch display device according to embodiments of the present disclosure, a frequency change pattern of a frequency of a touch driving signal changed over time during a first touch frame period may be equal to a frequency change pattern of a frequency of the touch driving signal changed over time during a second touch frame period.

During the first touch frame period, a frequency of the touch driving signal supplied to a first touch electrode of the plurality of touch electrodes may be changed from a first frequency change start value to a first frequency change end value.

During a second touch frame period different from the first touch frame period, a frequency of the touch driving signal supplied to the first touch electrode may be changed from a second frequency change start value to a second frequency change end value.

The second frequency change start value may be equal to the first frequency change start value, and the second frequency change end value may be equal to the first frequency change end value.

A frequency change pattern of a frequency of the touch driving signal changed over time during the first touch frame period and a frequency change pattern of a frequency of the touch driving signal changed over time during the second touch frame period may be increasing patterns.

In one embodiment, the first frequency change end value may be greater than the first frequency change start value, and the second frequency change end value may be greater than the second frequency change start value.

A frequency change pattern of a frequency of the touch driving signal changed over time during the first touch frame period and a frequency change pattern of a frequency of the touch driving signal changed over time during the second touch frame period may be decreasing patterns.

In one embodiment, the first frequency change end value may be smaller than the first frequency change start value, and the second frequency change end value may be smaller than the second frequency change start value.

A frequency change pattern of a frequency of the touch driving signal changed over time during the first touch frame period and a frequency change pattern of a frequency of the touch driving signal changed over time during the second touch frame period may be patterns of increasing and then decreasing.

In one embodiment, during the first touch frame period, a frequency of the touch driving signal supplied to the first touch electrode may be changed from the first frequency change start value to a first intermediate value and then to the first frequency change end value. During the second touch frame period, a frequency of the touch driving signal supplied to the first touch electrode may be changed from the second frequency change start value to a second intermediate value and then to the second frequency change end value. The first frequency change start value and the first frequency change end value may be substantially equal, and the first intermediate value may be greater than the first frequency change start value and the first frequency change end value. The second frequency change start value and the second frequency change end value may be substantially equal, and the second intermediate value may be greater than the second frequency change start value and the second frequency change end value.

A frequency change pattern of a frequency of the touch driving signal changed over time during the first touch frame period and a frequency change pattern of a frequency of the touch driving signal changed over time during the second touch frame period may be patterns of decreasing and then increasing.

In one embodiment, during the first touch frame period, a frequency of the touch driving signal supplied to the first touch electrode may be changed from the first frequency change start value to the first intermediate value and then to the first frequency change end value, and during the second touch frame period, a frequency of the touch driving signal supplied to the first touch electrode may be changed from the second frequency change start value to the second intermediate value and then to the second frequency change end value. The first frequency change start value and the first frequency change end value may be substantially equal, and the first intermediate value may be smaller than the first frequency change start value and the first frequency change end value. The second frequency change start value and the second frequency change end value may be substantially equal, and the second intermediate value may be smaller than the second frequency change start value and the second frequency change end value.

During the first touch frame period, the amount of frequency change per unit time may be constant for a time in which a frequency of the touch driving signal supplied to the first touch electrode increases or decreases, and during the second touch frame period, the amount of frequency change per unit time may be constant for a time in which a frequency of the touch driving signal supplied to the first touch electrode increases or decreases.

During the first touch frame period, the amount of frequency change per unit time may be variable for a time in which the frequency of the touch driving signal supplied to the first touch electrode increases or decreases. During the second touch frame period, the amount of frequency change per unit time may be variable for a time in which the frequency of the touch driving signal supplied to the first touch electrode increases or decreases.

In accordance with embodiments of the present disclosure, a method of driving a touch display device is provided that includes supplying a touch driving signal whose frequency is changed over time to at least one of a plurality of touch electrodes during a first touch frame period, and supplying the touch driving signal whose frequency is changed over time to the at least one of the plurality of touch electrodes during a second touch frame period different from the first touch frame period.

During the first touch frame period, a frequency of a touch driving signal supplied to a first touch electrode of the plurality of touch electrodes may be changed from a first frequency change start value to a first frequency change end value. During the second touch frame period, the frequency of the touch driving signal supplied to the first touch electrode may be changed in sync with a frequency change pattern of the touch driving signal supplied to the first touch electrode during the first touch frame period.

A second frequency change start value may be substantially equal to the first frequency change start value, and a second frequency change end value may be substantially equal to the first frequency change end value.

The touch driving signals are generated based on a reference signal, and a frequency change pattern of the touch driving signal may be substantially equal to a frequency change pattern of the reference signal.

In accordance with embodiments of the present disclosure, a touch driving circuit is provided that includes an operational amplifier including a first input terminal to which a touch driving signal is input, a second input terminal electrically connected to a touch electrode, and an output terminal from which an output signal is output, and a capacitor connected between the first input terminal and the output terminal of the operational amplifier.

A frequency of the touch driving signal may be changed over time.

During the first touch frame period, a frequency of a touch driving signal supplied to the touch electrode may be changed from a first frequency change start value to a first frequency change end value.

During a second touch frame period different from the first touch frame period, a frequency of a touch driving signal supplied to the touch electrode may be changed from a second frequency change start value to a second frequency change end value.

The second frequency change start value may be substantially equal to the first frequency change start value, and the second frequency change end value may be substantially equal to the first frequency change end value.

In accordance with embodiments of the present disclosure, a touch controller is provided that includes a signal generator generating a reference signal based on a touch synchronization signal and outputting the generated reference signal, and a processor acquiring touch location information based on sensing data and outputting the touch location information.

The touch synchronization signal may include alternate a first level voltage period representing a touch driving period and a second level voltage period representing a non-touch driving period.

One or more first level voltage periods included in the touch synchronization signal may correspond to one touch frame period.

A frequency of the reference signal may be changed over time.

During a first touch frame period, a frequency of the reference signal may be changed from a first frequency change start value to a first frequency change end value.

During a second touch frame period different from the first touch frame period, a frequency of the reference signal may be changed from a second frequency change start value to a second frequency change end value.

The second frequency change start value may be substantially equal to the first frequency change start value, and the second frequency change end value may be substantially equal to the first frequency change end value.

According to embodiments of the present disclosure, it is possible to provide the touch display devices having improved immunity to the EMI through frequency change of a touch driving signal.

According to embodiments of the present disclosure, it is possible to provide the touch display devices having a high SNR, as well as having improved immunity to the EMI, by synchronizing a frequency change pattern of a touch driving signal with a touch driving timing.

DETAILED DESCRIPTION

Figure 1:
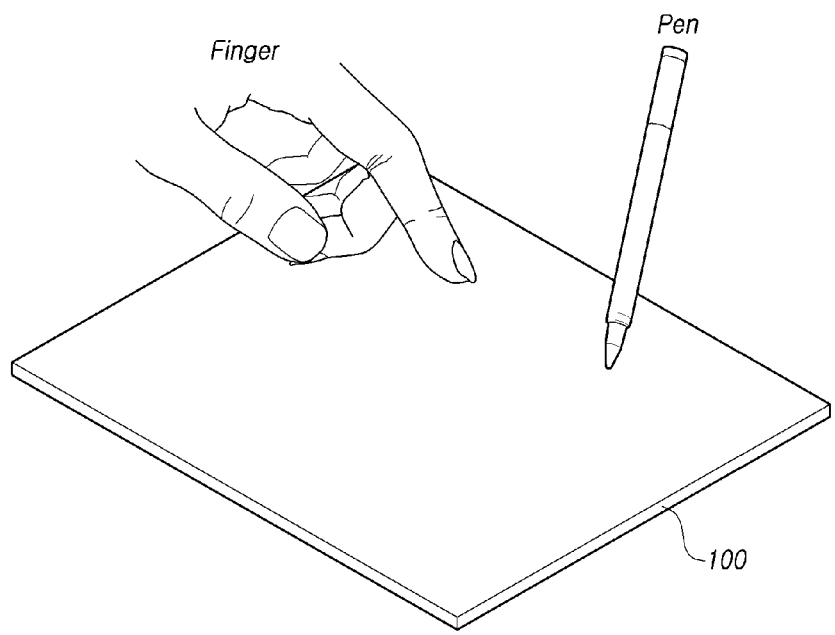
FIG. 1 illustrates schematically a touch display device according to embodiments of the present disclosure.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description may make the subject matter in some embodiments of the present invention rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present invention. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

FIG. 1 illustrates schematically a touch display device 100 according to embodiments of the present disclosure.

The touch display device 100 according to embodiments of the present disclosure is able to provide an image display function of displaying images, and a touch sensing function of sensing a touch by a touch object such as a finger, a pen, and/or the like.

Here, the term 'pen' is sometimes referred to as a stylus or a stylus pen, and may include an active pen that has signal transmission and reception functions, is able to perform an operation through interlinking with the touch display device 100, and/or includes its own power supply, a passive pen that does not have signal transmission and reception functions and/or does not include its own power supply, and the like.

In one embodiment, the touch display device 100 may be a television (TV), a computer monitor, a vehicle monitor, or the like, or may be a mobile device such as a tablet, a smart phone, and the like.

In one embodiment, the touch display device 100 may include a display part for displaying images and a touch sensing part for sensing touches.

Hereinafter, the display part and the touch sensing part of the touch display device 100 will be described in more detail with reference to FIGS. 2 and 3.

Figure 2:
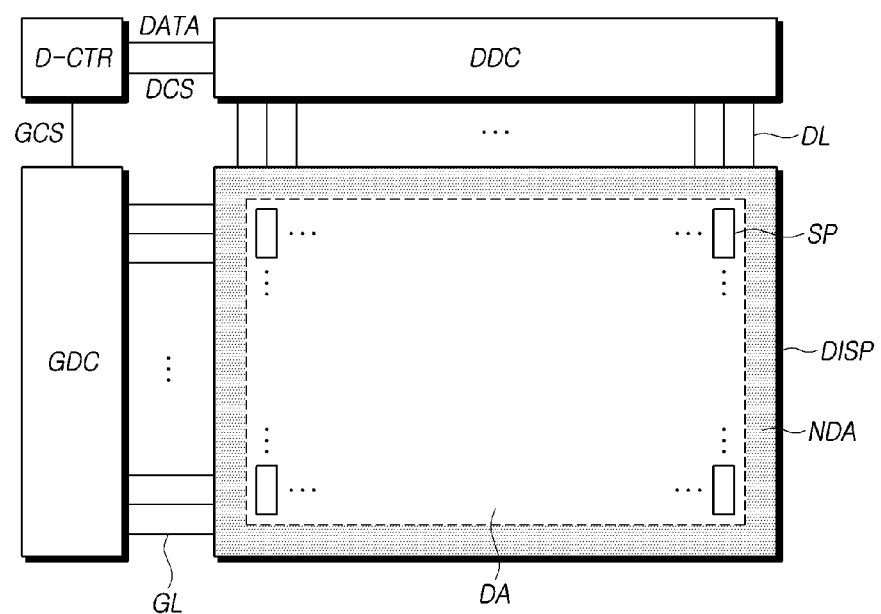
FIG. 2 illustrates display configurations needed for displaying images in the touch display device according to embodiments of the present disclosure.

FIG. 2 illustrates the display part of the touch display device 100 according to embodiments of the present disclosure.

Referring to FIG. 2, the display part of the touch display device 100 according to embodiments of the present disclosure includes a display panel DISP, a data driving circuit DDC, a gate driving circuit GDC, a display controller D-CTR, and the like.

The display panel DISP includes a plurality of data lines DL and a plurality of gate lines GL, and a plurality of sub-pixels SP connected to the plurality of data lines DL and the plurality of gate lines GL.

The display panel DISP may include a display area DA in which an image is displayed and a non-display area NDA in which an image is not displayed. The plurality of sub-pixels SP may be arranged in the display area DA of the display panel DISP. Various types of signal lines may be arranged in the non-display area NDA of the display panel DISP.

The data driving circuit DDC and the gate driving circuit GDC may be electrically connected to the non-display area NDA of the display panel DISP.

The data driving circuit DDC drives the plurality of data lines DL by supplying data voltages to the plurality of data lines DL.

The gate driving circuit GDC drives the plurality of gate lines GL by supplying gate signals (referred to as scan signals) to the plurality of gate lines GL.

The display controller D-CTR supplies various types of control signals (DCS, GCS) to the data driving circuit DDC and the gate driving circuit GDC to control operations of the data driving circuit DDC and the gate driving circuit GDC.

The display controller D-CTR starts a scanning operation according to timings scheduled in each frame, converts image data inputted from other devices or other image providing sources to a data signal type used in the data driving circuit DDC and then outputs image data DATA resulting from the converting, and controls the loading of the data to at least one pixel at a pre-configured time according to a scan signal.

The display controller D-CTR may be a timing controller TCON used in a typical display device, or a controller including the timing controller.

The display controller D-CTR may be implemented in a separate component from the data driving circuit DDC, or be integrated with the data driving circuit DDC into an integrated circuit.

The data driving circuit DDC may be located on, but not limited to, only one side (e.g., an upper side or a lower side) of the display panel DISP, or in another embodiment, the data driving circuit DDC may be located on, but not limited to, two sides (e.g., the upper side and the lower side) of the display panel DISP, according to driving schemes, panel design schemes, or the like.

The data driving circuit DDC may be electrically connected to the non-display area NDA of the display panel DISP. In another embodiment, the data driving circuit DDC may be disposed to overlap the display area DA of the display panel DISP.

The data driving circuit DDC may be implemented by including at least one source driver integrated circuit. Each source driver integrated circuit may include a shift register, a latch circuit, a digital-to-analog converter DAC, an output buffer, and the like. In some embodiments, each source driver integrated circuit may further include an analog-to-digital converter according to design schemes.

In some embodiments, the data driving circuit DDC may be connected to the display panel DISP in a tape automated bonding (TAB) type, or connected to a conductive pad such as a bonding pad of the display panel DISP in a chip on glass (COG) type or a chip on panel (COP) type, or connected to the display panel DISP in a chip on film (COF) type.

The gate driving circuit GDC may be located on, but not limited to, only one side (e.g., an upper side, a lower side, a left side, or a right side) of the display panel DISP, or in another embodiment, the gate driving circuit DDC may be located on, but not limited to, two sides (e.g., the left side and the right side) of the display panel DISP, according to driving schemes, panel design schemes, or the like.

The gate driving circuit GDC may be electrically connected to the non-display area NDA of the display panel DISP or may be disposed in the non-display area NDA of the display panel DISP. In one embodiment, the gate driving circuit GDC may be disposed to overlap the display area DA of the display panel DISP.

The gate driving circuit GDC may be implemented by including at least one gate driver integrated circuit. Each gate driving circuit GDC may include a shift register, a level shifter, and the like.

In some embodiments, the gate driving circuit GDC may be connected to the display panel DISP in the tape automated bonding (TAB) type, or connected to a conductive pad such as a bonding pad of the display panel DISP in the chip on glass (COG) type or the chip on panel (COP) type, or connected to the display panel DISP in the chip on film (COF) type. In another embodiment, the gate driving circuit GDC may be located in the non-display area NDA of the display panel DISP in a gate in panel (GIP) type. The gate driving circuit GDC may be disposed on or over a substrate SUB, or connected to the substrate SUB. That is, in the case of the GIP type, the gate driving circuit GDC may be disposed in the non-display area NDA of the substrate SUB. The gate driving circuit GDC may be connected to the substrate SUB in the case of the chip on glass (COG) type, the chip on film (COF) type, or the like.

Meanwhile, the display panel DISP may be one of various types of display panels such as a liquid crystal display panel, an organic light emitting display panel, an electroluminescence display panel, a plasma display panel, and the like.

Figure 3:
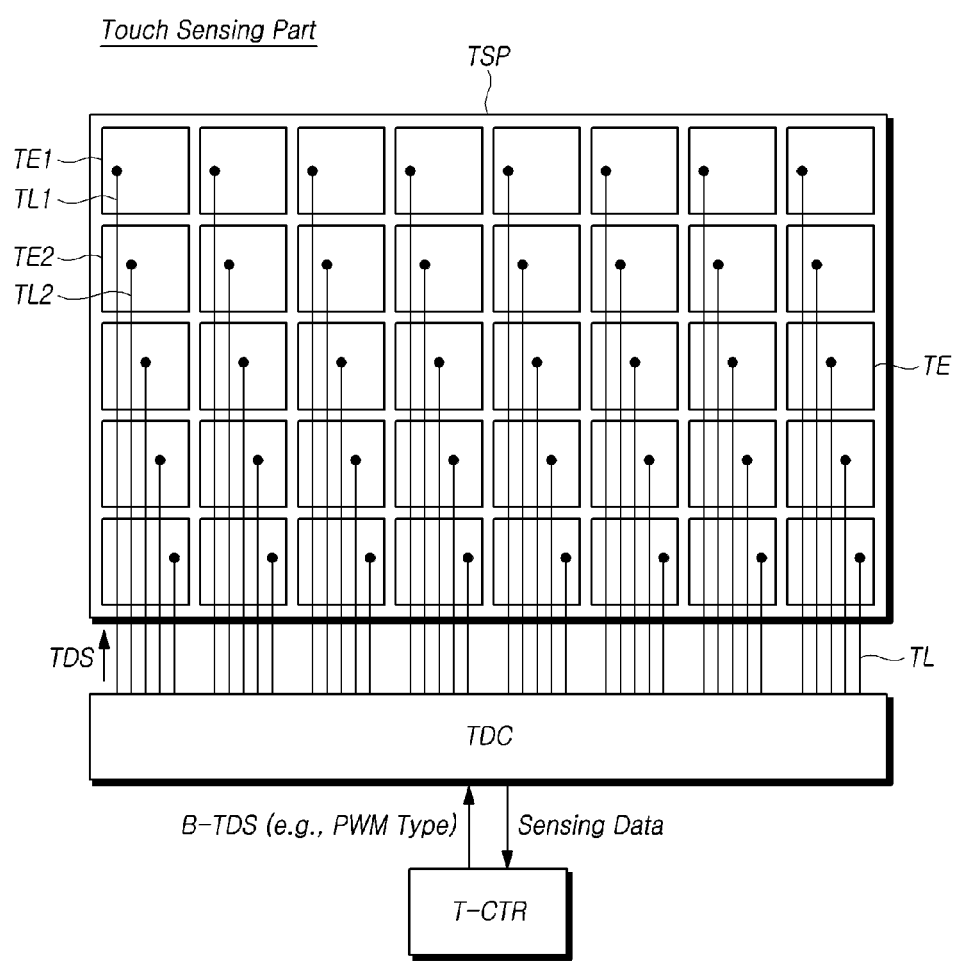
FIG. 3 illustrates touch sensing configurations needed for sensing touches in the touch display device according to embodiments of the present disclosure.
Figure 4:
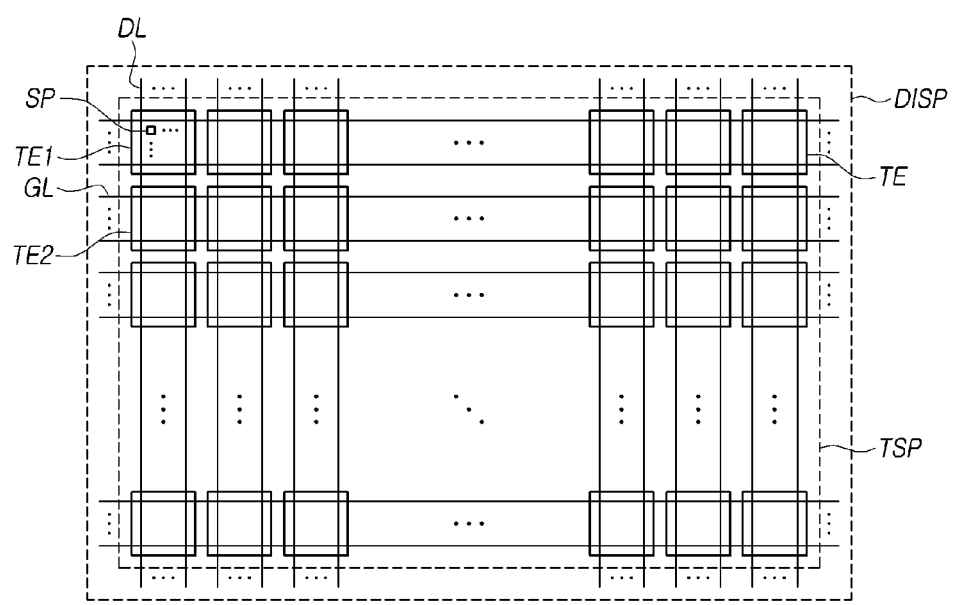
FIG. 4 illustrates a display panel and a touch panel included in the touch display device according to embodiments of the present disclosure.

FIG. 3 illustrates a touch sensing part of the touch display device 100 according to embodiments of the present disclosure. FIG. 4 illustrates a display panel DISP and a touch panel TSP included in the touch display device 100 according to embodiments of the present disclosure.

Referring to FIG. 3, in order to sense a touch input by a finger and/or a pen, the touch display device 100 according to embodiments of the present disclosure includes a touch panel TSP, a touch driving circuit TDC, a touch controller T-CTR, and the like.

The touch panel TSP may include a plurality of touch electrodes TE, a plurality of touch lines TL for electrically connecting the plurality of touch electrodes TE to the touch driving circuit TDC, and the like.

The touch driving circuit TDC can supply a touch driving signal TDS to all or a part of the plurality of touch electrodes TE, generate sensing data by sensing all or the part of the plurality of touch electrodes TE, and supply the generated sensing data to the touch controller T-CTR. Here, the sensing of the touch electrode TE by the touch driving circuit TDC may mean detecting an electric signal from the touch electrode TE.

The touch controller T-CTR may acquire information on the presence or absence of a touch, and/or touch coordinates (a touch position) using sensing data received from the touch driving circuit TDC.

The touch driving signal TDS may be a signal whose voltage level is changed over time. In an embodiment, the touch driving signal TDS may have one or more of various types of signals, such as a square wave, a triangle wave, a sine wave, and the like.

The touch display device 100 can provide a self-capacitance-based touch sensing function that senses a touch by measuring a capacitance formed across each touch electrode TE or a change in such capacitance, or a mutual-capacitance-based touch sensing function that senses a touch by measuring a capacitance between touch electrodes TE or a change in such capacitance.

The touch display device 100 can provide both the self-capacitance-based touch sensing function and the mutual-capacitance-based touch sensing function. In an embodiment, the touch display device 100 can provide the self-capacitance-based touch sensing function and the mutual-capacitance-based touch sensing function at different time periods.

When the touch display device 100 provides the self-capacitance-based touch sensing function, the touch driving circuit TDC can supply a touch driving signal TDS to each of the plurality of touch electrodes TE, and sense the touch electrode TE to which the driving signal TDS is applied. Here, sensed data resulting from such sensing may correspond to self-capacitance of the corresponding touch electrode TE.

When the touch display device 100 provides the mutual-capacitance-based touch sensing function, a plurality of touch electrodes TE are classified into driving touch electrodes and sensing touch electrodes, and the touch driving circuit TDC can supply a touch driving signal TDS to each of the driving touch electrodes and sense each of the sensing touch electrodes. Here, sensed data resulting from such sensing may correspond to mutual capacitance formed by the corresponding sensing touch electrode and the corresponding driving touch electrode.

Meanwhile, in the touch display device 100 according to embodiments of the present disclosure, the touch panel TSP may located outside of the display panel DISP or may be embedded in the display panel DISP.

When the touch panel TSP is located outside of (e.g., external to) the display panel DISP, the touch panel TSP and the display panel DISP are manufactured in different manufacturing processes, and thereafter, the touch panel TSP and the display panel DISP may be bonded.

When the touch panel TSP is embedded in the display panel DISP, a plurality of touch electrodes TE may be formed together during a process in which the display panel DISP is manufactured.

Meanwhile, the plurality of touch electrodes TE may be dedicated electrodes for touch sensing.

In another embodiment, the plurality of touch electrodes TE may be electrodes utilized even when display driving is performed. In an embodiment, not only is the plurality of touch electrodes TE utilized for touch sensing, but the plurality of touch electrodes TE may serve as a common electrode to which a common voltage is applied when display driving is performed.

Hereinafter, for convenience of description, it is assumed that the touch display device 100 provides the self-capacitance-based touch sensing function, and the touch panel TSP is embedded in the display panel DISP.

In an embodiment, referring to FIG. 3, in the touch panel TSP of the touch display device 100 according to embodiments of the present disclosure, a plurality of touch electrodes TE may be arranged in a matrix pattern.

Referring to FIG. 3, each of the plurality of touch electrodes TE may be electrically connected to a touch driving circuit TDC through one or more touch lines TL.

Referring to FIG. 3, a plurality of touch lines TL may overlap one or more touch electrodes TE. In some embodiments, the plurality of touch lines TL may be connected to the touch driving circuit TDC by running along an area where the plurality of touch electrodes TE are not disposed.

Referring to FIG. 3, the plurality of touch electrodes TE may include a first touch electrode TE1 and a second touch electrode TE2 arranged in the same column direction. The plurality of touch lines TL may include a first touch line TL1 electrically connecting between the first touch electrode TE1 and the touch driving circuit TDC, and a second touch line TL2 electrically connecting between the second touch electrode TE2 and the touch driving circuit TDC.

The first touch line TL1 may overlap the first touch electrode TE1 and the second touch electrode TE2. The first touch line TL1 may be electrically connected to the first touch electrode TE1 in the touch panel TSP, but may be insulated from the second touch electrode TE2 in the touch panel TSP.

The second touch line TL2 may overlap the second touch electrode TE2, and may or may not overlap the first touch electrode TEL The second touch line TL2 may be electrically connected to the second touch electrode TE2 in the touch panel TSP, but may be insulated from the first touch electrode TE1 in the touch panel TSP.

The first touch line TL1 and the second touch line TL2 may be insulated from each other in the touch panel TSP. The first touch line TL1 and the second touch line TL2 may be electrically connected in the touch driving circuit TDC at a specific driving timing. In an embodiment, during a driving timing period in which a common voltage for display driving is required to be simultaneously applied to the first touch electrode TE1 and the second touch electrode TE2, the first touch line TL1 and the first touch line TL2 may be electrically connected in the touch driving circuit TDC.

Although FIG. 3 illustrates that each touch electrode TE has a square block shape, this is merely an example for convenience of description; embodiments described herein are not limited thereto. In an embodiment, the touch electrode TE may be designed in various shapes, such as a diamond, a long rectangle, or the like. Although FIG. 3 illustrates that all of the plurality of touch electrodes TE have the same size and shape, this is merely an example for convenience of description. The embodiments described herein are not limited thereto. In an embodiment, at least one of sizes and shapes of some of the plurality of touch electrodes TE may be different from sizes and shapes of the other touch electrodes TE.

Referring to FIG. 4, as described above, the touch panel TSP may be embedded in the display panel DISP. In this embodiment, a plurality of touch electrodes TE may be formed together in a process of manufacturing the display panel DISP.

A size of an area in which one touch electrode TE is disposed may correspond to a size of an area in which one sub-pixel SP is disposed. In another embodiment, as illustrated in FIG. 4, a size of an area in which one touch electrode TE is disposed may be larger than a size of an area in which one sub-pixel SP is disposed.

When a size of an area in which one touch electrode TE is disposed is larger than a size of an area in which two or more sub-pixels SP are disposed, one touch electrode TE may overlap two or more data lines DL and two or more gate lines GL.

In an embodiment in which a first touch electrode TE1 and a second touch electrode TE2 among a plurality of touch electrodes are disposed in the same column direction, the first touch electrode TE1 may overlap two or more data lines and two or more gate lines. The second touch electrode TE2 may also overlap two or more data lines and two or more gate lines.

Two or more data lines overlapping the first touch electrode TE1 and two or more data lines overlapping the second touch electrode TE2 may be the same. Two or more gate lines overlapping the first touch electrode TE1 and two or more gate lines overlapping the second touch electrode TE2 may be different from each other.

The touch driving circuit TDC and the touch controller T-CTR may be implemented in respective separate components or integrated into one component.

In an embodiment, the touch driving circuit TDC may be implemented in a readout IC, and the touch controller T-CTR may be implemented in a micro control unit MCU.

Meanwhile, the touch driving circuit TDC and the data driving circuit DDC may be integrated and implemented in one integrated circuit chip.

The touch display device 100 may include one or more integrated driving circuits SRIC. Each integrated driving circuit SRIC may include one or more touch driving circuits TDC and one or more data driving circuits DDC.

Meanwhile, the touch controller T-CTR can supply a reference signal B-TDS serving as the reference of a touch driving signal TDS.

The reference signal B-TDS supplied by the touch controller T-CTR may be input to the touch driving circuit TDC or may be input to the touch power integrated circuit. The reference signal B-TDS input to the touch power integrated circuit may be directly input to the touch driving circuit TDC or may be changed to a touch driving signal TDS and then input to the touch driving circuit TDC.

As described above, the touch driving signal TDS may have one or more of various types of signals, such as a square wave (a pulse wave), a triangle wave, a sine wave, and the like. In an embodiment, when a touch driving signal TDS of a square wave is employed, the reference signal B-TDS may be a type of a pulse width modulation (hereinafter referred to as PWM) signal.

Hereinafter, for convenience of description, it is assumed that the touch driving signal TDS is a pulse waveform type and the reference signal B-TDS is a PWM signal type. Accordingly, hereinafter, the reference numeral of the reference signal B-TDS is expressed as "PWM".

Figure 5:
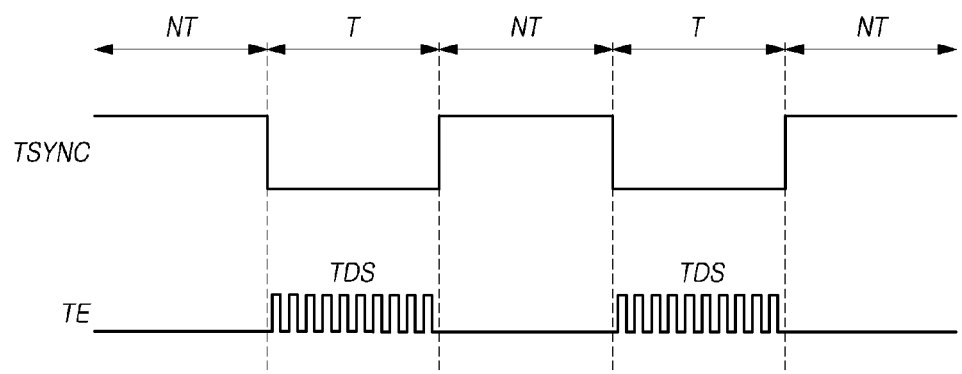
FIG. 5 is a timing diagram illustrating touch driving of the touch display device according to embodiments of the present disclosure.

FIG. 5 is a timing diagram illustrating touch driving of the touch display device 100 according to embodiments of the present disclosure.

Referring to FIG. 5, the touch display device 100 according to embodiments of the present disclosure may use a touch synchronization signal TSYNC that defines a touch driving period T for touch sensing.

In the touch display device 100 according to embodiments of the present disclosure, the display controller D-CTR, the touch controller T-CTR, and the touch driving circuit TDC can recognize touch driving timings for touch sensing based on the touch synchronization signal TSYNC.

In an embodiment, the display controller D-CTR can supply the touch synchronization signal TSYNC to the touch controller T-CTR, and the touch controller T-CTR can supply the received touch synchronization signal TSYNC to the touch driving circuit TDC.

The touch synchronization signal TSYNC may include alternate a first level voltage period representing a touch driving period T and a second level voltage period representing a non-touch driving period NT.

In an embodiment, the first level voltage period of the touch synchronization signal TSYNC may be a period having a predetermined low level voltage, and the second level voltage period of the touch synchronization signal TSYNC may be a period having a high level voltage greater than the predetermined low level voltage. In another embodiment, the first level voltage period of the touch synchronization signal TSYNC may be a period having a relative high level voltage, and the second level voltage period of the touch synchronization signal TSYNC may be a period having a relative low level voltage.

When the first level voltage period of the touch synchronization signal TSYNC received from the touch controller T-CTR starts, the touch driving circuit TDC can supply a touch driving signal TDS to a predetermined touch electrode TE, and then sense the touch electrode TE.

In an embodiment, in the touch display device 100 according to embodiments of the present disclosure, touch and display operations can be time multiplexed for performing touch driving and display driving. That is, the touch display device 100 can perform time division of one display frame period into one or more touch driving periods T and one or more display driving periods, and alternately perform touch driving and display driving. In this embodiment, the first level voltage period of the touch synchronization signal TSYNC may be the touch driving period T, and the non-touch driving period NT indicated by the second level voltage period of the touch synchronization signal TSYNC may be the display driving period for displaying an image.

In another embodiment, in the touch display device 100 according to embodiments of the present disclosure, touch and display operations can be performed at the same time during at least one time period without the application of time division multiplexing. In this embodiment, the first level voltage period of the touch synchronization signal TSYNC may become both the display driving period and the touch driving period T. Further, the non-touch driving period NT indicated by the second level voltage period of the touch synchronization signal TSYNC may be a blank period between display driving periods. In an embodiment, the touch synchronization signal TSYNC may be a vertical synchronization signal VSYNC that is used when display driving is performed, and includes, and alternates between, a high level voltage period (or a low level voltage period) representing an active period (a display driving period) and the low level voltage period (or the high level voltage period) representing a blank period.

The touch display device 100 according to embodiments of the present disclosure uses the touch synchronization signal TSYNC to define a touch frame period, which is a period during which the entire sensible area of the touch panel TSP is sensed.

In an embodiment, the touch display device 100 according to embodiments of the present disclosure may assign one touch driving period T indicated by one first level voltage period included in the touch synchronization signal TSYNC as one touch frame period.

In another embodiment, the touch display device 100 according to embodiments of the present disclosure may assign two or more touch driving periods T indicated by two or more first level voltage periods included in the touch synchronization signal TSYNC as one touch frame period.

Referring to FIG. 5, when the touch display device 100 performs touch driving and display driving based on the time division, and a touch electrode TE is also used as a common electrode for the display driving, the touch driving circuit TDC may supply a common voltage, which may be a direct current (DC) voltage, to the touch electrode TE during a non-touch driving period NT, and supply a touch driving signal TDS to the touch electrode TE during a touch driving period T.

Meanwhile, while the touch driving signal TDS whose voltage level is changed is applied to a touch electrode TE required to be sensed among the plurality of touch electrodes TE, when a DC voltage or a signal having voltage variable characteristics different from the touch driving signal TDS is applied to one or more neighboring electrodes or lines, a parasitic capacitor may be formed between the sensed touch electrode TE and the one or more neighboring electrodes TE or lines. Such a parasitic capacitor affects a sensing value of the touch electrode TE to be sensed, thus, resulting in touch sensitivity being significantly reduced.

In an embodiment, while the touch driving signal TDS is applied to the touch electrode TE required to be sensed, the touch display device 100 may apply a signal having the same one or more of frequency, amplitude, and phase as the touch driving signal TDS to one or more other electrodes or lines located adjacent to the sensed touch electrode TE. Here, the signal having the same one or more of frequency, amplitude, and phase as the touch driving signal TDS is referred to as "load free driving signal".

In an embodiment, one or more other electrodes or lines located adjacent to the sensed touch electrode TE may include one or more data lines DL, one or more gate lines GL, one or more other touch electrodes TE that are not sensed, and/or the like.

For example, in a case where the touch panel TSP is embedded in the display panel DISP, when touch driving is performed, a touch driving signal TDS may be applied to one or more touch electrodes required to be sensed among a plurality of touch electrodes TE disposed on the display panel DISP, and a load free driving signal that is the same one or more of frequency, amplitude, and phase as the touch driving signal TDS may be applied to some or all of the remaining touch electrodes TE, some or all of the data lines DL, and/or some or all of the gate lines GL.

Figure 6:
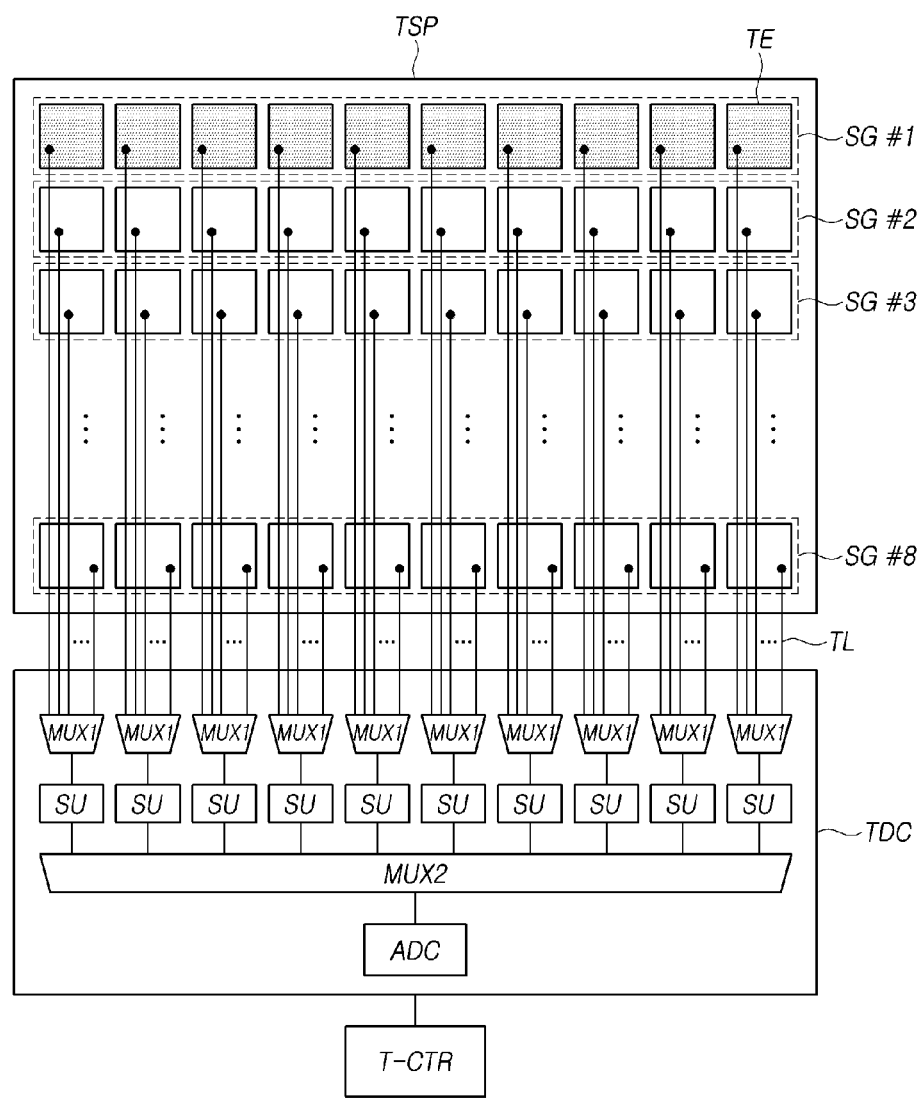
FIG. 6 illustrates a touch sensing system having a structure for group-based driving in the touch display device according to embodiments of the present disclosure.

FIG. 6 illustrates a touch sensing system having a structure for group-based driving in the touch display device 100 according to embodiments of the present disclosure.

Referring to FIG. 6, a plurality of touch electrodes TE included in the touch panel TSP may be arranged in a matrix pattern. The touch panel TSP shown in FIG. 6 may include eight rows of touch electrodes. The touch panel TSP may include 10 rows of touch electrodes.

The touch driving circuit TDC may include a plurality of first multiplexers MUX1, a plurality of sensing units SU, one or more second multiplexers MUX2, one or more analog-to-digital converters ADC, and the like.

The number of the plurality of first multiplexers MUX1 may equal to the number of touch electrodes TE that can be sensed at the same time. The plurality of sensing units SU may correspond to the plurality of first multiplexers MUX1 on a one-to-one basis.

In an embodiment, as shown in FIG. 6, ten touch electrodes TE may be sensed at substantially the same time. In this embodiment, the touch driving circuit TDC may include ten first multiplexers MUX1.

The touch display device 100 according to embodiments of the present disclosure can define eight sensing groups SG #1 to SG #8 that can be substantially simultaneously sensed, and while sequentially sensing the eight sensing groups SG #1 to SG #8, substantially simultaneously sense the respective ten touch electrodes TE included in the eight sensing groups SG #1 to SG #8.

In the embodiment of FIG. 6, one touch frame period corresponds to a period taken for sensing all eight sensing groups SG #1 to SG #8.

Each of the ten first multiplexers MUX1 may be connected to eight touch electrodes TE arranged in the same touch electrode column through eight touch lines TL. Here, the eight touch electrodes TE arranged in the same touch electrode column may be included one by one in eight sensing groups SG #1 to SG #8.

Each of the ten first multiplexers MUX1 can select one of the eight touch electrodes TE and electrically connect between the selected touch electrode and a corresponding sensing unit SU. Accordingly, the sensing unit SU can sense the touch electrode TE selected by the first multiplexer MUX1.

Each of the ten first multiplexers MUX1 can sequentially select eight touch electrodes TE so that the eight sensing groups SG #1 to SG #8 can be sequentially sensed. In this manner, each of the ten sensing units SU can sequentially sense the eight touch electrodes TE.

The second multiplexer MUX2 can select one of the ten sensing units SU and connect the selected sensing unit SU to the analog-to-digital converter ADC. As a result, the analog-to-digital converter ADC can convert a signal output from the selected sensing unit SU, which has been obtained by the sensing of the selected sensing unit SU for the corresponding touch electrode TE, into a digital sensing value.

The touch driving circuit TDC can transmit sensing data including the digital sensing value converted by the analog-to-digital converter ADC to the touch controller T-CTR.

Figure 7:
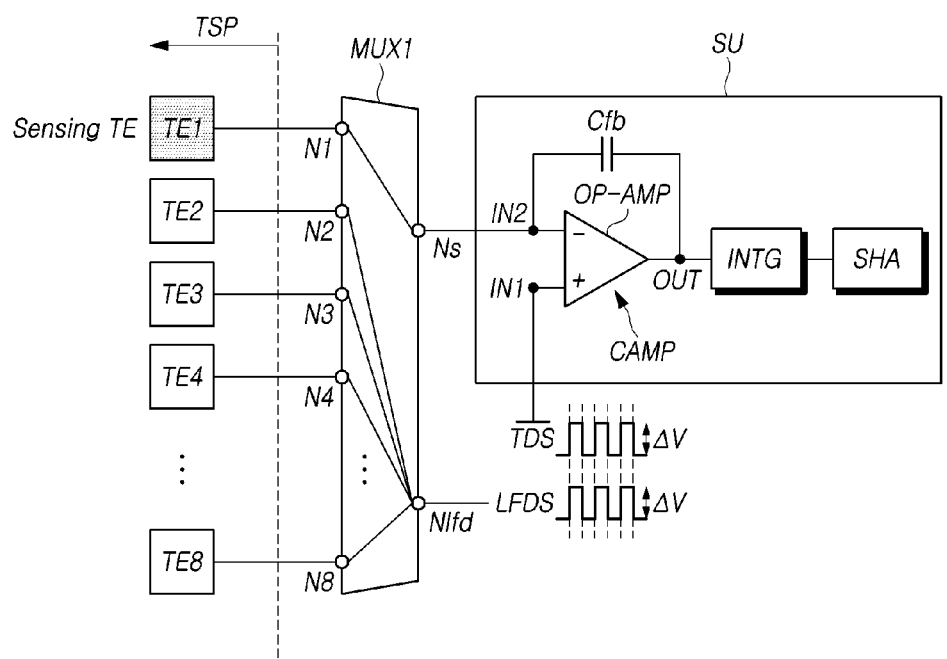
FIG. 7 illustrates a sensing unit in a touch driving circuit of the touch display device according to embodiments of the present disclosure.

FIG. 7 illustrates the sensing unit SU in the touch driving circuit TDC of the touch display device 100 according to embodiments of the present disclosure.

Referring to FIG. 7, the sensing unit SU may include a charge amplifier CAMP, an integrator INTG, a sample and hold circuit SHA, and the like.

The same first multiplexer MUX1 may include eight nodes N1 to N8 connected to eight touch electrodes TE1 to TE8 arranged in the same touch electrode column, a sensing node Ns to which the sensing unit SU is connected, and a load-free driving node N1fd to which a load-free driving signal LFDS is input.

FIG. 7 illustrates an embodiment in which a first touch electrode TE1 of the eight touch electrodes TE1 to TE8 arranged in the same touch electrode column is a sensing touch electrode, and the remaining touch electrodes TE2 to TE8 are non-sensing touch electrodes.

Accordingly, in the first multiplexer MUX1, the sensing node Ns is connected to the first node N1 to which the first touch electrode TE1 is connected among the eight nodes N1 to N8, and the load-free driving node N1fd may be connected to all, or a part (the second node N2 disposed closest to the first node N1), of the remaining nodes N2 to N8 except for the first node N1 among the eight nodes N1 to N8.

The charge amplifier CAMP may include an operational amplifier OP-AMP including a first input terminal IN1 to which a touch driving signal TDS is input, and a second input terminal IN2 electrically connected to a touch electrode TE selected by the first multiplexer MUX1 as a sensing touch electrode, and an output terminal OUT from which an output signal Vout is output, and a capacitor Cfb connected between the first input terminal IN1 and the output terminal OUT of the operational amplifier OP-AMP.

The touch driving signal TDS input to the first input terminal IN1 can be output to the second input terminal IN2 through the inside of the operational amplifier OP-AMP, and then input to the sensing node Ns connected to the second input terminal IN2. Accordingly, the touch driving signal TDS can be applied to the first touch electrode TE1 connected to the sensing node Ns.

Further, the load-free driving signal LFDS applied to the load-free driving node Nlfd may be applied to all or some of the non-sensing touch electrodes TE2 to TE8 through the load-free driving node Nlfd. An amplitude AV of the load-free driving signal LFDS may be the same as the amplitude AV of the touch driving signal TDS, or a frequency of the load-free driving signal LFDS may be the same as a frequency of the touch driving signal TDS, or a phase of the load-free driving signal LFDS may be the same as a phase of the touch driving signal TDS.

The charge amplifier CAMP can receive a touch sensing signal from the first touch electrode TE1 to which the touch driving signal TDS is applied. Electric charge can be written in the feedback capacitor Cfb by the received touch sensing signal, and thereby, an output signal Vout output to the output terminal OUT of the charge amplifier CAMP can be input to the integrator INTG.

The integrator INTG can integrate the output signal Vout output from the charge amplifier CAMP, and then output a resulting integral value. The integrator INTG may be configured separately from the charge amplifier CAMP, or may be implemented integrally with the charge amplifier CAMP.

The sample and hold circuit SHA can store the integral value output from the integrator INTG. When the corresponding sensing unit SU is selected by the second multiplexer MUX2, the integral value stored in the sample and hold circuit SHA can be input to the analog-to-digital converter ADC.

Figure 8:
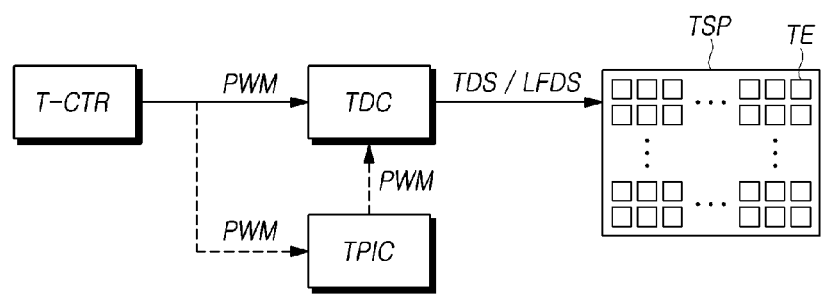
FIG. 8 illustrates a signal supply system for touch driving of the touch display device according to embodiments of the present disclosure.

FIG. 8 illustrates a signal supply system for touch driving of the touch display device 100 according to embodiments of the present disclosure.

Referring to FIG. 8, the touch controller T-CTR can generate a reference signal PWM that serves as the reference of a touch driving signal TDS, and output the reference signal PWM to at least one of the touch driving circuit TDC and the touch power integrated circuit TPIC.

In an embodiment, the touch driving circuit TDC can receive the reference signal PWM from the touch controller T-CTR, and based on the input reference signal PWM, output a touch driving signal TDS and a load-free driving signal LFDS to the touch panel TSP.

In another embodiment, the touch driving circuit TDC can receive the reference signal PWM from the touch power integrated circuit TPIC, and based on the input reference signal PWM, output the touch driving signal TDS and the load-free driving signal LFDS to the touch panel TSP.

The touch driving signal TDS can be applied to one or more touch electrodes TE required to be sensed, and the load-free driving signal LFDS can be applied to other touch electrodes TE that are not sensed.

Figure 9:
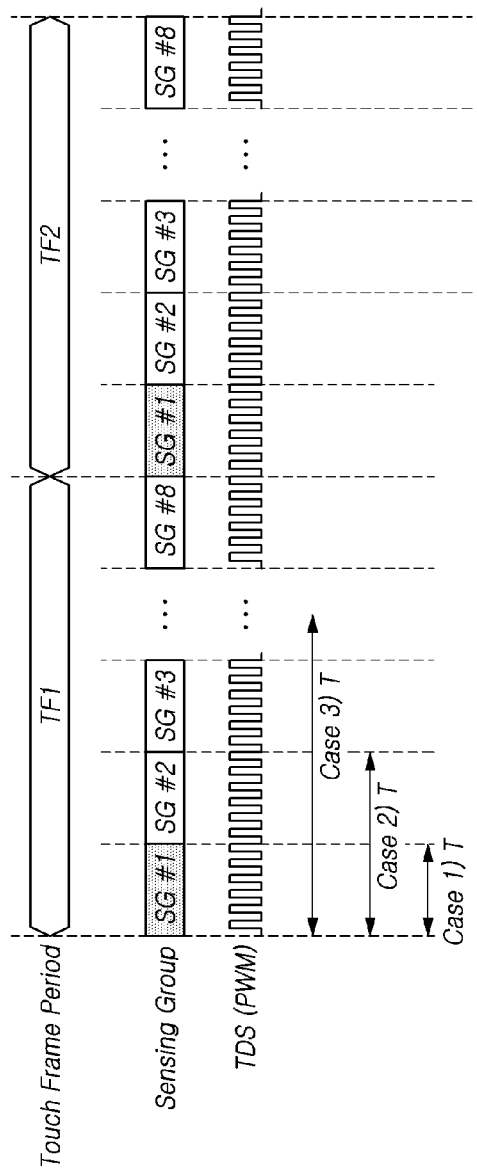
FIG. 9 is a timing diagram illustrating touch driving during a first touch frame period and a second touch frame period in the touch display device according to embodiments of the present disclosure.

FIG. 9 is a timing diagram illustrating touch driving during a first touch frame period TF1 and a second touch frame period TF2 in the touch display device 100 according to embodiments of the present disclosure. In this situation, the group-based driving structure of FIG. 6 can be considered together.

Referring to the group-based driving structure of FIG. 6 together with the illustration in FIG. 9, during the first touch frame period TF1, eight sensing groups SG #1 to SG #8 disposed in the touch panel TSP can be sequentially sensed. Subsequently, during the second touch frame period TF2, the eight sensing groups SG #1 to SG #8 disposed in the touch panel TSP can be sequentially sensed.

Referring to FIG. 9, during one touch driving period T defined by a first level voltage period of the touch synchronization signal TSYNC, one of the eight sensing groups SG #1 to SG #8 can be sensed (Case 1).

In another embodiment, during one touch driving period T defined by the first level voltage period of the touch synchronization signal TSYNC, two of the eight sensing groups SG #1 to SG #8 can be sensed (Case 2).

In further another embodiment, during one touch driving period T defined by the first level voltage period of the touch synchronization signal TSYNC, four of the eight sensing groups SG #1 to SG #8 can be sensed (Case 3).

In yet another embodiment, during one touch driving period T defined by the first level voltage period of the touch synchronization signal TSYNC, three or more, or five or more, of the eight sensing groups SG #1 to SG #8 can be sensed.

Hereinafter, for convenience of explanation, it is assumed that during one touch driving period T defined by the first level voltage period of the touch synchronization signal TSYNC, two of the eight sensing groups SG #1 to SG #8 is sensed (Case 2).

Referring to FIG. 9, the touch driving circuit TDC can supply, during the first touch frame period TF1, a touch driving signal TDS to touch electrodes included in eight sensing groups SG #1 to SG #8 disposed in the touch panel TSP and sense the touch electrodes, and during the second touch frame period TF2, supply the touch driving signal TDS to the touch electrodes included in the eight sensing groups SG #1 to SG #8 disposed in the touch panel TSP and sense the touch electrodes. In this situation, a frequency of the touch driving signal TDS supplied from the touch driving circuit TDC to the touch electrodes TE may be continuously constant.

Figure 10:
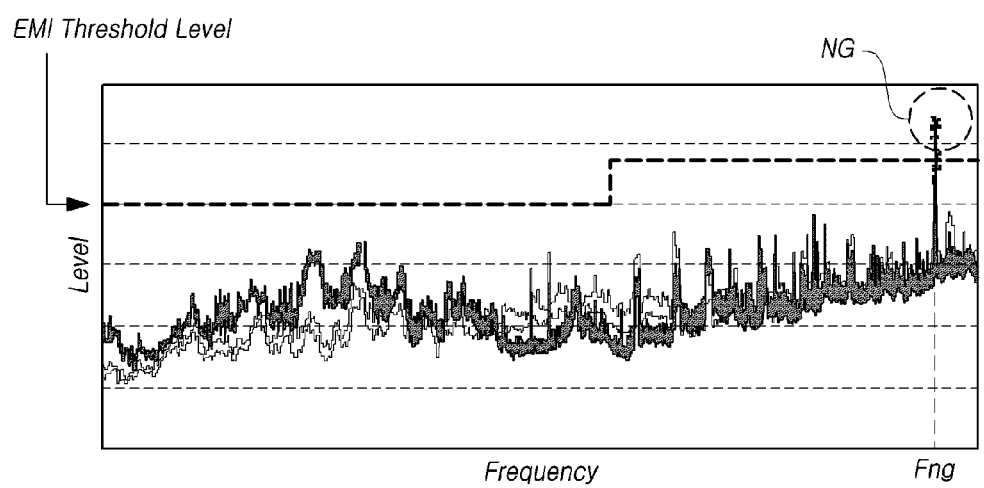
FIG. 10 is a plot illustrating electromagnetic interference (EMI) in the touch display device according to embodiments of the present disclosure.

FIG. 10 is a plot illustrating electromagnetic interference (EMI) in the touch display device according to embodiments of the present disclosure.

FIG. 10 shows a result obtained by measuring EMI, which is a noise component, generated in the touch display device 100 when the touch driving circuit TDC performs touch driving using a touch driving signal TDS having a constant frequency.

Referring to FIG. 10, in the touch display device 100, EMI having a level (e.g., a voltage level) exceeding a predefined EMI reference level may be produced at any frequency. In order for the touch display device 100 to normally perform touch sensing and display, it is necessary for EMI having a level below the EMI reference level to be generated. Here, the EMI reference level may have a constant value or may vary depending on frequency ranges. In an embodiment, the EMI reference level in the predefined high frequency range may have a value greater than the EMI reference level in the lower frequency range than the predefined high frequency range.

EMI having a level (e.g. a voltage level) exceeding the EMI reference level may occur at any frequency, and when the EMI NG having the level exceeding the EMI reference level occurs at the frequency Fng of the touch drive signal TDS, there may occur a situation where corresponding touch sensitivity is significantly degraded.

Figure 11:
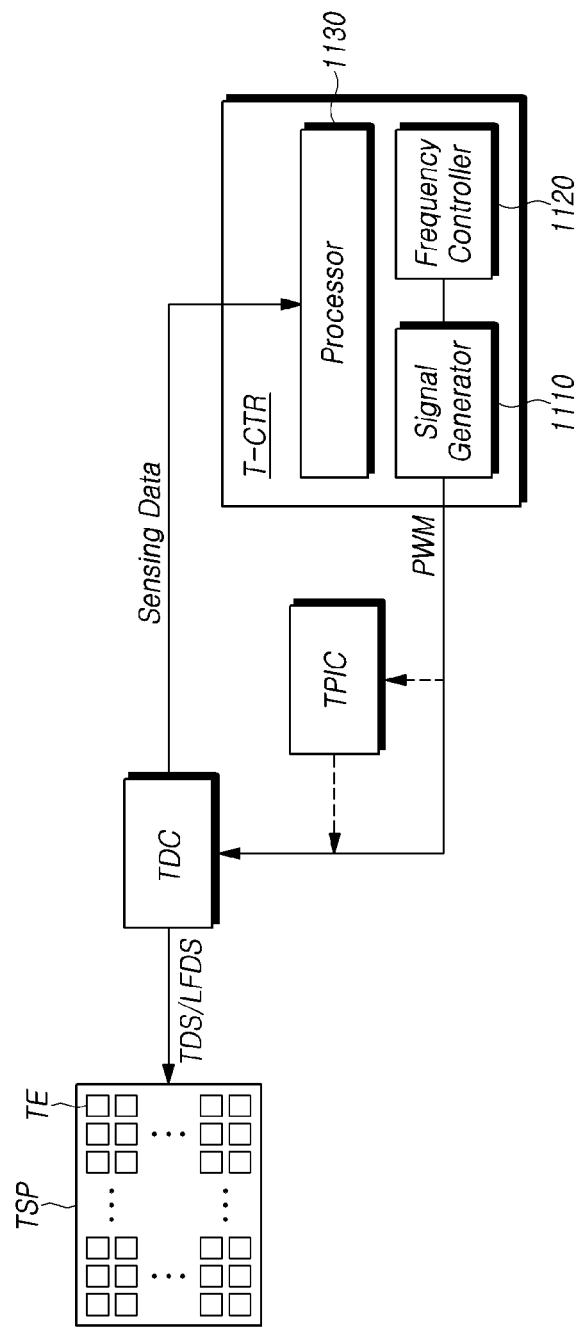
FIG. 11 illustrates a touch driving circuit and a touch controller of the touch display device according to embodiments of the present disclosure.

FIG. 11 illustrates the touch driving circuit TDC and the touch controller T-CTR of the touch display device 100 according to embodiments of the present disclosure.

Referring to FIG. 11, the touch display device 100 according to embodiments of the present disclosure may change a frequency of a touch driving signal TDS to prevent performance degradation due to the EMI.

According to this approach, as the probability that a frequency at which EMI having a level exceeding the EMI reference level may occur coincides with the frequency of the touch driving signal TDS can be lowered, thus, the degradation of touch sensitivity due to EMI can be prevented.

In an embodiment, in order to change a frequency of a touch driving signal TDS, when generating a reference signal PWM that serves as the reference of the touch driving signal TDS, the touch controller T-CTR in the touch display device 100 can generate and output a reference signal PWM whose frequency is changeable over time.

The touch controller T-CTR can generate the reference signal PWM having a changed frequency, and then output the generated signal to either the touch driving circuit TDC or the touch driving circuit TDC through the touch power integrated circuit TPIC.

Accordingly, the touch driving circuit TDC can supply the touch driving signal TDS having a changed frequency and a load-free driving signal LFDS having a changed frequency to the touch panel TSP.

Referring to FIG. 11, the touch controller T-CTR may include a signal generator 1110, a frequency controller 1120, a processor 1130, and the like.

The processor 1130 can control the signal generator 1110, the frequency controller 1120, and the like, and control the overall operation of the touch controller T-CTR. Further, the processor 1130 can receive sensing data from the touch driving circuit TDC and execute a touch algorithm to calculate the presence or absence of a touch and/or a touch location (touch coordinates).

The signal generator 1110 can change a frequency of a corresponding reference signal PWM based on a control signal of the frequency controller 1120, and output the reference signal PWM having a changed frequency.

Figure 12:
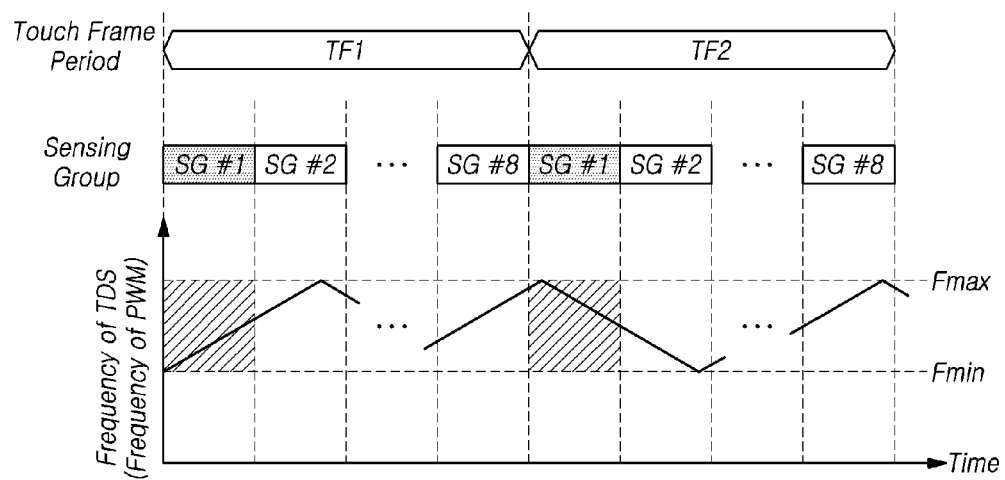
FIG. 12 is a timing diagram illustrating touch driving when the touch display device performs the touch driving using a touch driving signal with a changed frequency according to embodiments of the present disclosure.

FIG. 12 is a timing diagram illustrating touch driving when the touch display device 100 performs the touch driving using a touch driving signal TDS having a changed frequency according to embodiments of the present disclosure.

Referring to FIG. 12, a frequency of the touch driving signal TDS may be changed according to a frequency change pattern of a reference signal PWM. That is, the frequency change pattern of the reference signal PWM is equal to a frequency change pattern of the touch driving signal TDS. Therefore, hereinafter, it should be appreciated that even when one of the frequency change pattern of the reference signal (PWM) and the frequency change pattern of the touch driving signal (TDS) is described, the one may also mean the other.

Referring to the group-based driving structure of FIG. 6 together with the illustration in FIG. 12, during a first touch frame period TF1, a touch driving signal TDS having a changed frequency can be sequentially supplied to eight sensing groups SG #1 to SG #8 disposed in the touch panel TSP, and then, during a second touch frame period TF2, the touch driving signal TDS having a changed frequency can be sequentially supplied to the eight sensing groups SG #1 to SG #8 disposed in the touch panel TSP.

Referring to FIG. 12, a frequency change pattern of the touch driving signal TDS during the first touch frame period TF1 and a frequency change pattern of the touch driving signal TDS during the second touch frame period TF2 may not be equal to each other.

In an embodiment, during the first touch frame period TF1, the frequency change pattern of the touch driving signal TDS applied to the first sensing group SG #1 may be a pattern in which the frequency increases. During the second touch frame period TF2, the frequency change pattern of the touch driving signal TDS applied to the first sensing group SG #1 may be a pattern in which the frequency increases and then decreases.

That is, touch electrodes TE included in the first sensing group SG #1 can receive the touch driving signal TDS having the frequency showing the pattern of increasing during the first touch frame period TF1, and receive the touch driving signal TDS having the frequency showing the pattern of increasing and then decreasing during the second touch frame period TF2.

As a result, as the touch driving signal TDS having different frequency change patterns is applied to the same touch electrode TE in the respective first and second touch frame periods TF1 and TF2, there may occur a phenomenon in which a signal-to-noise ratio (SNR) for a sensed value resulting from the corresponding touch electrode TE decreases. This phenomenon may be referred to as "an SNR reduction phenomenon due to a touch driving signal TDS having a frequency change pattern that is not synchronized with a touch driving timing".

Hereinafter, a method of preventing or at least reducing the degradation of the SNR will be discussed by applying a touch driving signal TDS having the same frequency change pattern to the same touch electrode TE in each of the first touch frame period TF1 and the second touch frame period TFT2. That is, hereinafter, a method of "SNR improvement using a touch driving signal TDS having a frequency change pattern synchronized with a touch driving timing" will be described.

Figure 13:
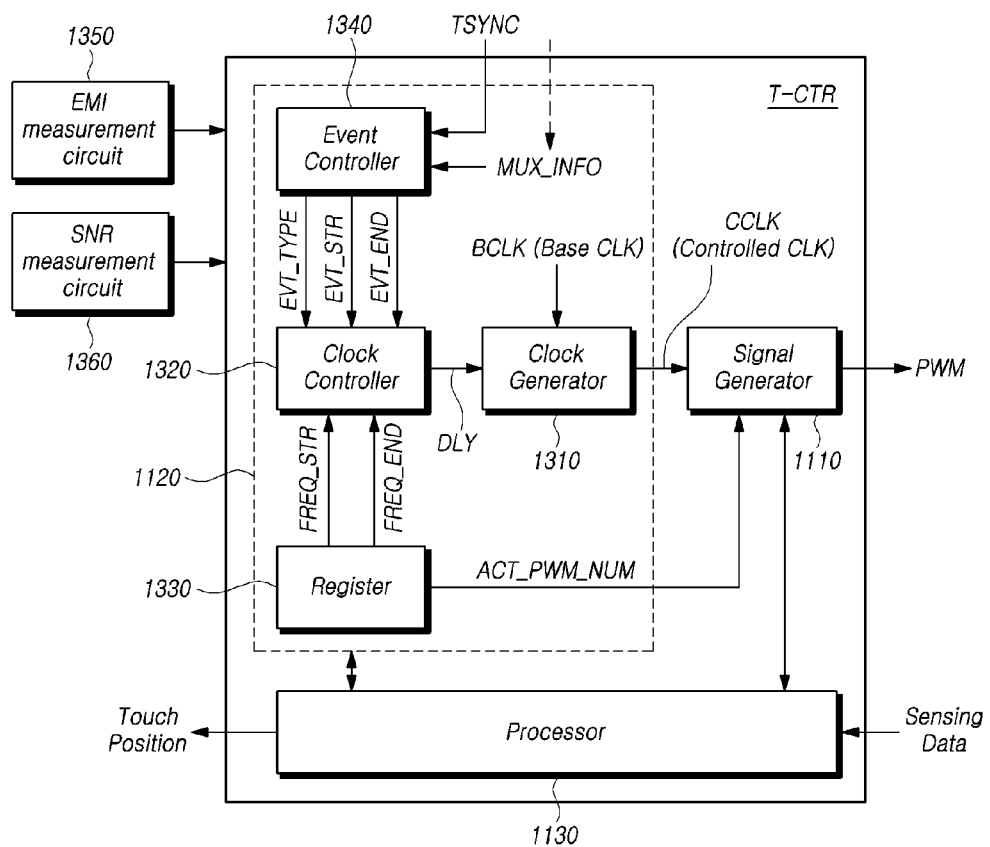
FIG. 13 is a block diagram illustrating a touch controller generating a reference signal serving as a reference of a touch driving signal whose frequency is changed in sync with a touch driving timing in the touch display device according to embodiments of the present disclosure.
Figure 14:
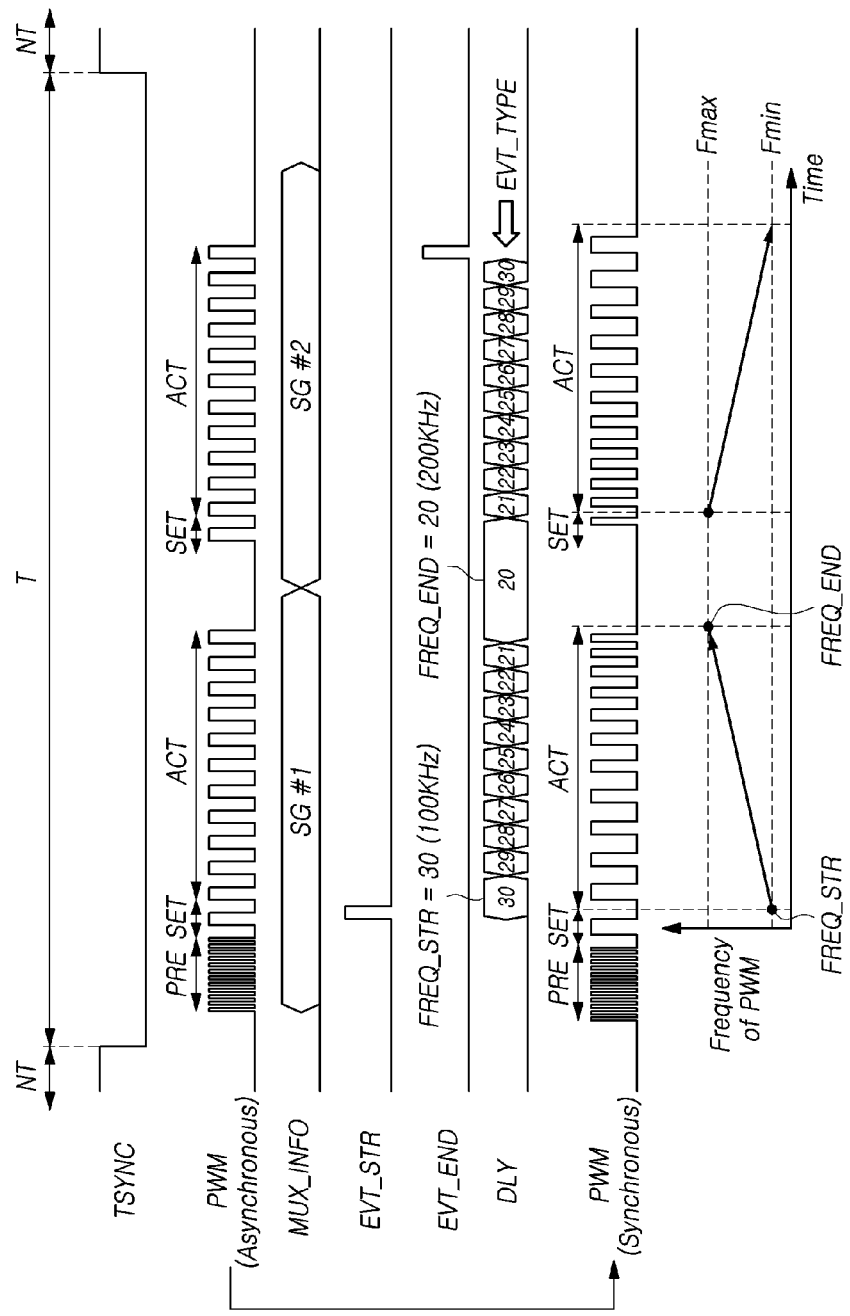
FIG. 14 illustrates a method of the touch controller of the touch display device for generating a reference signal serving as the reference for generating a touch driving signal according to embodiments of the present disclosure.

FIG. 13 illustrates a touch controller T-CTR generating a reference signal PWM serving as the reference of a touch driving signal TDS whose frequency is changed in sync with a touch driving timing in the touch display device 100 according to embodiments of the present disclosure. FIG. 14 illustrates a method of the touch controller T-CTR of the touch display device 100 for generating a reference signal serving as the reference for generating a touch driving signal according to embodiments of the present disclosure.

Referring to FIG. 13, the touch controller T-CTR can output a reference signal PWM and receive sensing data from the touch driving circuit TDC. The touch driving circuit TDC can output a touch driving signal TDS to the touch panel TSP.

Referring to FIGS. 13 and 14, the touch driving signal TDS may be generated based on the reference signal PWM. A frequency change pattern of the touch driving signal TDS may be equal to a frequency change pattern of the reference signal PWM. The reference signal PWM and the touch driving signal TDS may include an active pulse period ACT in which a corresponding frequency is changed, and at least one dummy pulse period (PRE, SET) locating prior to the active pulse period ACT.

Referring to FIG. 13, for improving corresponding SNR using a touch driving signal TDS having a frequency change pattern synchronized with a touch driving timing, the touch controller T-CTR may further include a clock generator 1310, a clock controller 1320, a register 1330, an event controller 1340, and the like, in addition to the signal generator 1110 and the processor 1130. The clock generator 1310, the clock controller 1320, the register 1330, and the event controller 1340 may be components included in the frequency controller 1120 of FIG. 11.

FIG. 14 is a diagram for explaining a method of the touch controller T-CTR for generating a reference signal PWM having a frequency change pattern synchronized with a touch driving timing, and illustrates a situation where during one touch driving period T indicated by a first level voltage period of one touch synchronization signal TSYNC, a first sensing group SG #1 and a second sensing group SG #2 are sequentially sensed.

In the illustration of FIG. 14, a frequency change pattern of a touch driving signal TDS supplied to touch electrodes TE included in the first sensing group SG #1 in order to sense the first sensing group SG #1 is a pattern in which the frequency of the touch driving signal TDS increases, and a frequency change pattern of the touch driving signal TDS supplied to touch electrodes TE included in the second sensing group SG #2 in order to sense the second sensing group SG #2 is a pattern in which the frequency of the touch driving signal TDS decreases.

Referring to FIG. 13, the signal generator 1110 can generate a reference signal PWM whose frequency is changed over time based on the touch synchronization signal TSYNC, and output the generated reference signal PWM. The processor 1130 can acquire and output information on a touch location based on sensed data.

Referring to FIGS. 13 and 14, the touch synchronization signal TSYNC may include alternate a first level voltage period representing a touch driving period T and a second level voltage period representing a non-touch driving period NT.

One or more first level voltage periods included in the touch synchronization signal TSYNC may correspond to one touch frame period. That is, one or more touch driving periods T defined by one or more first level voltage periods included in the touch synchronization signal TSYNC may be included in one touch frame period.

As described above, the frequency of the reference signal PWM may be changed over time.

Referring to FIG. 14, during the first touch frame period TF1, a frequency of the reference signal PWM that serves as the reference of the touch driving signal TDS supplied to the first sensing group SG #1 may be changed from a first frequency change start value FREQ_STR to a first frequency change end value FREQ_END.

As described above, during the first touch frame period TF1, since the frequency change pattern of the touch driving signal TDS supplied to the touch electrodes TE included in the first sensing group SG #1 to sense the first sensing group SG #1 is a pattern in which the frequency of the touch driving signal TDS increases, and the frequency change pattern of the touch driving signal TDS supplied to the touch electrodes TE included in the second sensing group SG #2 to sense the second sensing group SG #2 is a pattern in which the frequency of the touch driving signal TDS decreases, during the first touch frame period TF1, the frequency of the reference signal PWM serving as the reference of the touch driving signal TDS supplied to the second sensing group SG #2 may be changed from the first frequency change end value FREQ_END to the first frequency change start value FREQ_STR.

During a second touch frame period TF2 different from the first touch frame period TF1 shown in FIG. 14, a frequency of the reference signal PWM serving as the reference of the touch driving signal TDS supplied to the first sensing group SG #1 may be changed from a second frequency change start value to a second frequency change end value.

In an embodiment, the second frequency change start value may be equal to the first frequency change start value FREQ_STR so that the respective frequency change patterns of the first and second touch frame periods TF1 and TF2 can be substantially equal. The second frequency change end value may be equal to the first frequency change end value FREQ_END. Accordingly, during the first touch frame period TF1 and the second touch frame period TF2, the frequency change patterns of the touch driving signal TDS applied to the same touch electrode TE may be equal, and corresponding SNR may be improved by the touch driving signal TDS having the frequency change pattern synchronized with touch driving timings.

Referring to FIG. 14, the reference signal PWM and the touch driving signal TDS generated based thereon may basically include an active pulse period ACT, and further include a pre-pulse period PRE and/or a setting pulse period SET prior to the active pulse period ACT.

The reference signal PWM and the touch driving signal TDS generated based thereon may include one pre-pulse period PRE in each touch driving period T, and include one setting pulse period SET for each sensing group (SG #1, SG #2).

The active pulse period ACT may be a signal period in which the touch driving circuit TDC actually performs signal detection processing (sensing processing). The changing of the frequency of the reference signal PWM or the touch driving signal TDS may mean that a frequency of pulses in the active pulse period ACT is changed.

The pre-pulse period PRE is a signal period related to various types of controls for touch sensing. In an embodiment, a signal of the pre-pulse period PRE may be an uplink signal transmitted from the touch panel TSP to a pen, which may be a signal for synchronizing an operation timing between the touch display device 100 and the pen. The pre-pulse period PRE may be a signal period on which control information is carried, and in this case, a corresponding pulse pattern may change according to carried information without a predetermined period.

The setting pulse period SET may include one pulse or pulses having the same period. The setting pulse period SET may be synchronization pulses. Before receiving the active pulse period ACT, the touch driving circuit TDC may check the setting pulse period SET. The touch driving circuit TDC may check in advance the frequency of the active pulse period ACT according to the check result of the setting pulse period SET. The touch driving circuit TDC may synchronize the internal clock signal of the touch driving circuit TDC according to the frequency of the active pulse period ACT. According to embodiments described herein for frequency changes of the reference signal PWM and the touch driving signal TDS, one or more components included in the frequency controller 1120 may substitute for the function of the setting pulse period SET.

Referring to FIGS. 13 and 14, the register 1330 can store a first frequency change start value FREQ_STR and a first frequency change end value FREQ_END of a changed frequency of the touch driving signal TDS supplied to the first sensing group SG #1 in the touch driving period T, and store the number of active pulses ACT_PWM_NUM, which is the number of pulses in the active pulse period ACT of the reference signal PWM and the touch drive signal TDS.

The register 1330 can supply the first frequency change start value FREQ_STR and the first frequency change end value FREQ_END to the clock controller 1320, and supply the number of active pulses ACT_PWM_NUM to the signal generator 1110.

Referring to FIGS. 13 and 14, the event controller 1340 can receive the touch synchronization signal TSYNC related to touch driving timings and multiplexing driving information MUX_INFO, and output event type information EVT_TYPE, event start information EVT_STR, and event end information EVT_END, which are control information for frequency changes, to the clock controller 1320.

Here, the touch synchronization signal TSYNC may be received from the display controller D-CTR. The multiplexing driving information MUX_INFO may be stored in advance in the register 1330 or may be received from the display controller D-CTR. The multiplexing driving information MUX_INFO may include information (e.g., position information, driving order information, etc.) on sensing groups SG #1 to SG #8.

The event type information EVT_TYPE may be information defining a frequency change pattern of a reference signal PWM. Here, the frequency change pattern may include an increasing pattern, a decreasing pattern, an increasing and then decreasing pattern, a decreasing and then increasing pattern, and the like. The event type information EVT_TYPE shown in FIG. 14 may mean a pattern in which the corresponding frequency increases and then decreases. Considering a relationship in which as a value of clock delay information DLY decreases, the frequency increases, and as the value of the clock delay information DLY increases, the frequency decreases, a pattern in which a frequency increases and then decreases may mean a pattern in which a value of clock delay information DLY decreases and then increases.

The event start information EVT_STR may represent an end time (or a start time of a first active pulse period ACT) of a first setting pulse period SET in one touch driving period T. In an embodiment, during one touch driving period T, when the first sensing group SG #1 and the second sensing group SG #2 are sequentially sensed, an event start information EVT_STR may represent an end time (or a start time of an active pulse period ACT) of a setting pulse period SET of a touch driving signal TDS for sensing the first sensing group SG #1 in one touch driving period T.

An event end information EVT_END may represent an end time of a last active pulse period ACT in one touch driving period T. In an embodiment, during one touch driving period T, when the first sensing group SG #1 and the second sensing group SG #2 are sequentially sensed, an event end information EVT_END may represent an end time of an active pulse period ACT of a touch driving signal TDS for sensing the second sensing group SG #2 in one touch driving period T.

Referring to FIGS. 13 and 14, the clock controller 1320 can receive the event type information EVT_TYPE, the event start information EVT_STR, and the event end information EVT_END, and receive information on the first frequency change start value FREQ_STR and the first frequency change end value FREQ_END from the register 1330.

Referring to FIGS. 13 and 14, the clock controller 1320 can supply clock delay information DLY based on the event type information EVT_TYPE, the event start information EVT_STR, the event end information EVT_END, the first frequency change start value FREQ_STR, and the first frequency change end value FREQ_END.

For example, when a value of the clock delay information DLY is 30, this may denote that the frequency of a corresponding signal is 100 KHz, and when a value of the clock delay information DLY is 20, this may denote that the frequency is 200 KHz.

When the clock delay information DLY is less than 30, this may denote that the frequency is higher than 100 KHz. When the clock delay information DLY is greater than 20, this may denote that the frequency is lower than 200 KHz.

The clock generator 1310 can receive a base clock signal BCLK whose frequency is not changed, delay pulses included in the base clock signal BCLK according to the clock delay information DLY, and then generate and output a control clock signal CCLK whose frequency is controlled (changed).

The signal generator 1110 can generate and output a reference signal PWM by changing the control clock signal CCLK based on the number of active pulses ACT_PWM_NUM.

When a frequency of the reference signal PWM is changed, the frequency may be changed between a maximum value Fmax and a minimum value Fmin. In an embodiment, referring to FIG. 14, when a frequency change pattern is a pattern where the frequency increases and then decreases, the first frequency change start value FREQ_STR may be the minimum value Fmin, and the first frequency change end value FREQ_END may be the maximum value Fmin.

Meanwhile, the touch display device 100 according to embodiments of the present disclosure may further include an EMI measurement circuit 1350 measuring corresponding EMI and an SNR measurement circuit 1360 measuring corresponding SNR.

The EMI measurement circuit 1350 can supply an EMI measurement result to the touch controller T-CTR. Accordingly, when it is determined that touch sensitivity is degraded due to the EMI based on the EMI measurement result, the touch controller T-CTR can change a frequency change pattern of the reference signal PWM by changing one or more of the event type information EVT_TYPE, the first frequency change start value FREQ_STR, and the first frequency change end value FREQ_END.

The SNR measurement circuit 1360 can supply a SNR measurement result to the touch controller T-CTR. Accordingly, when it is determined that a corresponding SNR is reduced based on the SNR measurement result, the touch controller T-CTR can change a frequency change pattern of the reference signal PWM by changing one or more of the event type information EVT_TYPE, the first frequency change start value FREQ_STR, and the first frequency change end value FREQ_END.

Examples of a reference signal PWM and a touch driving signal TDS, respective frequencies of which are changed in sync with touch driving timings according to a method of controlling frequency changes and frequency change patterns described above, are shown in FIGS. 15A to 15L.

FIGS. 15A to 15L are block diagrams illustrating touch driving in a scenario where the touch display device 100 performs the touch driving using a touch driving signal TDS whose frequency is changed in various schemes in sync with a touch driving timing according to embodiments of the present disclosure.

FIGS. 15A to 15L illustrate, based on the group-based driving structure of FIG. 6, frequency change patterns of a touch driving signal TDS supplied to touch electrodes TE included in eight sensing groups SG #1 to SG #8 disposed in the touch panel TSP during a first touch frame period TF1, and frequency change patterns of the touch driving signal TDS supplied to the touch electrodes TE included in the eight sensing groups SG #1 to SG #8 disposed in the touch panel TSP during a second touch frame period TF2.

Referring to FIGS. 15A to 15L, during the first touch frame period TF1, frequencies of the touch driving signal TDS supplied to a first touch electrode TE of the touch electrodes TE may be changed from first frequency change start values FREQ_STR1 to first frequency change end values FREQ_ENDE Here, the first touch electrode TE mentioned below is a touch electrode TE included in the first sensing group SG #1.

Referring to FIGS. 15A to 15L, during a second touch frame period TF1 different from the first touch frame period TF1, frequencies of the touch driving signal TDS supplied to the first touch electrode TE may be changed from second frequency change start values FREQ_STR2 to second frequency change end values FREQ_END2.

Referring to FIGS. 15A to 15L, the second frequency change start values FREQ_STR2 may be substantially equal to the first frequency change start values FREQ_STR1. The second frequency change end values FREQ_END2 may be substantially equal to the first frequency change end values FREQ_ENDE Accordingly, the touch driving signal TDS and its reference signal PWM may have a frequency change pattern that is synchronized with touch driving timings.

Figure 15A:
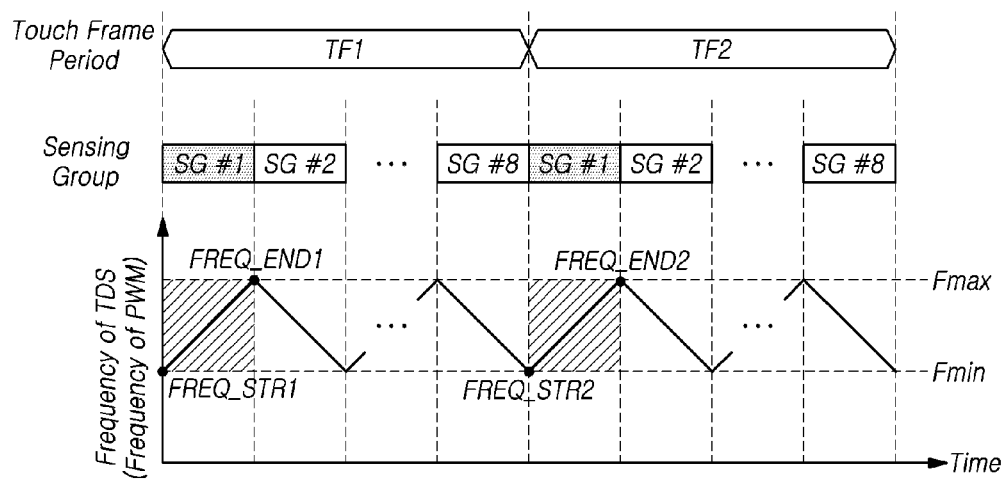
FIGS. 15A to 15L are block diagrams illustrating touch driving when the touch display device performs touch driving using a touch driving signal whose frequency is changed in various schemes in sync with a touch driving timing according to embodiments of the present disclosure.
Figure 15B:
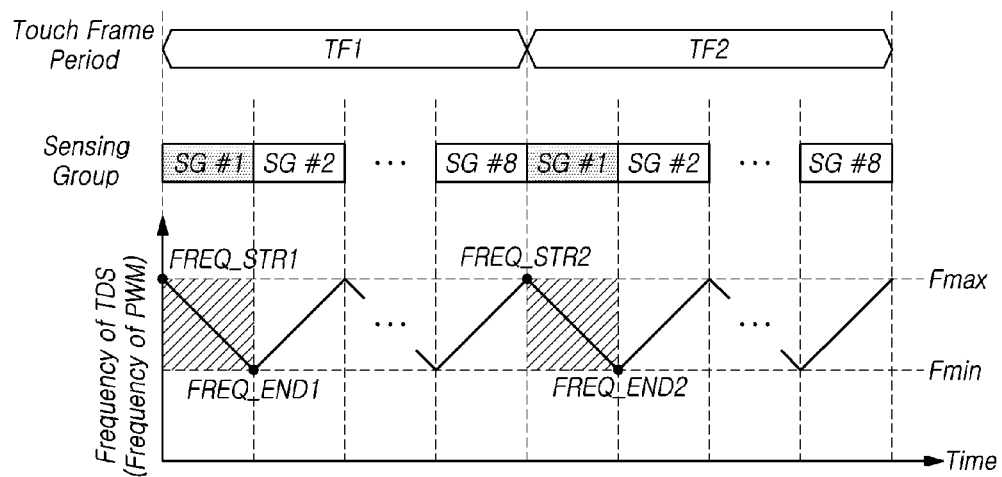
Figure 15C:
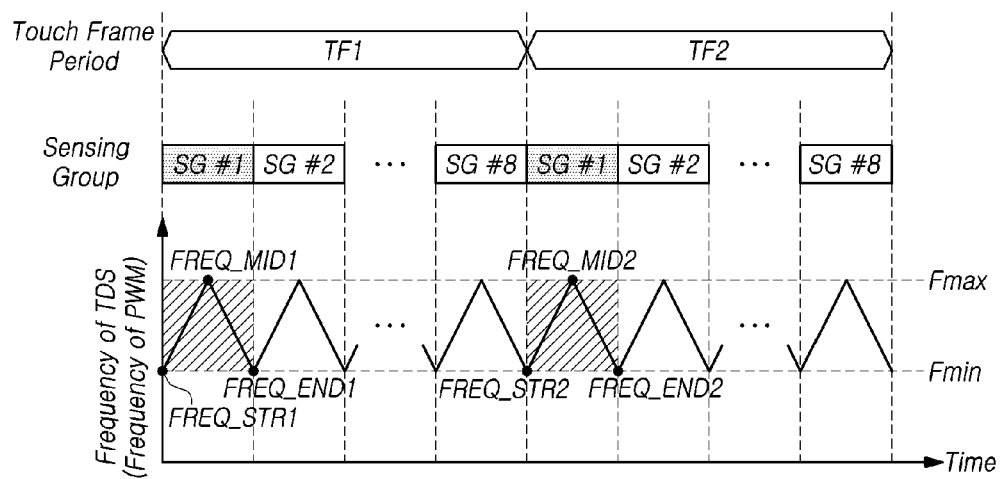
Figure 15D:
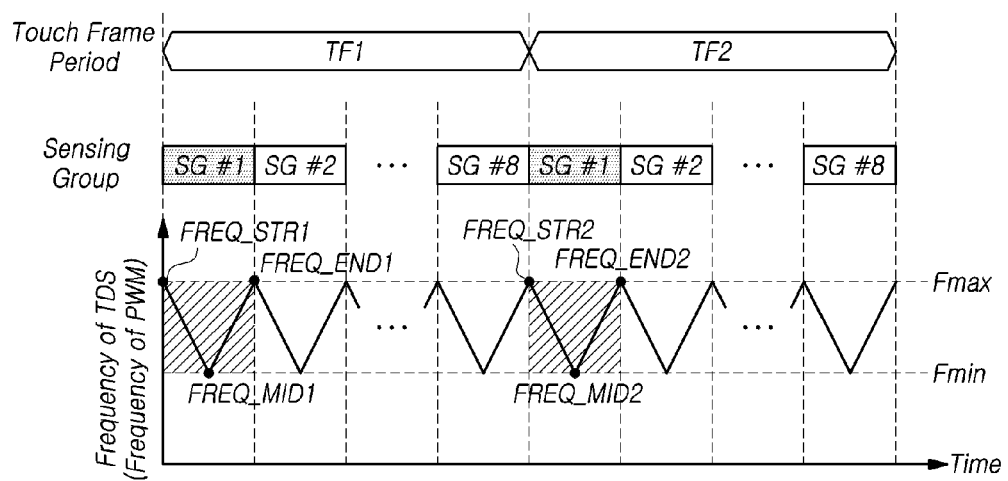
Figure 15E:
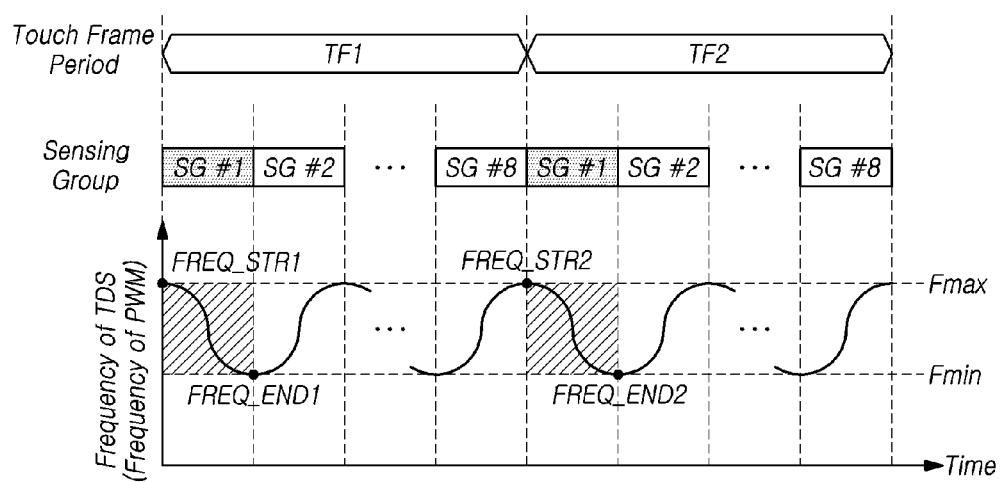
Figure 15F:
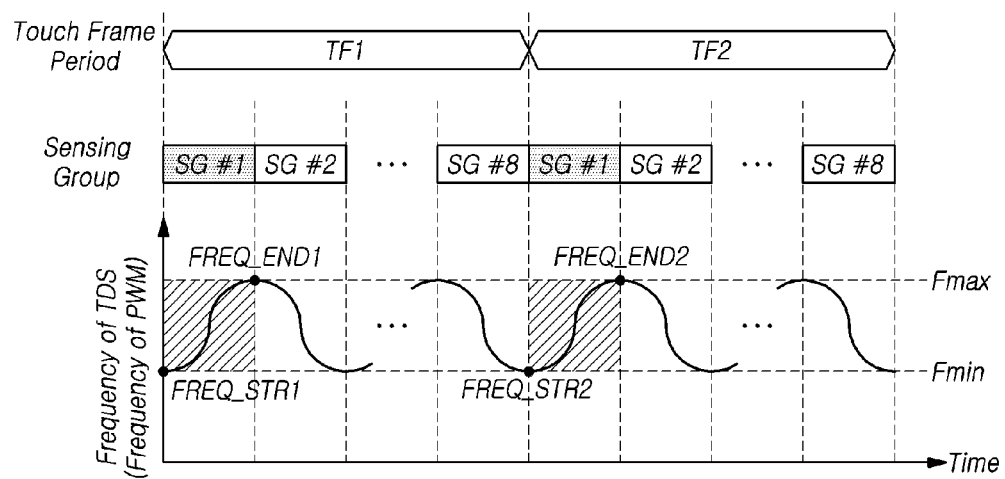
Figure 15G:
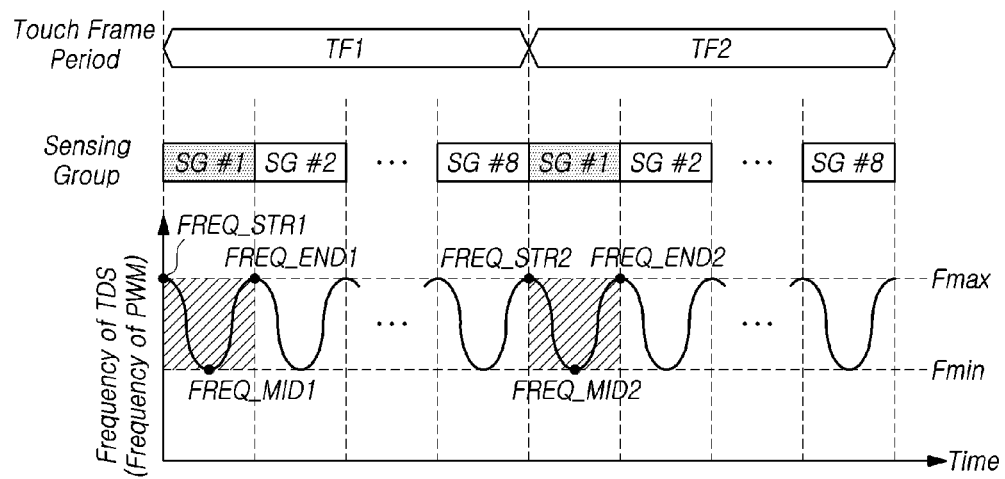
Figure 15H:
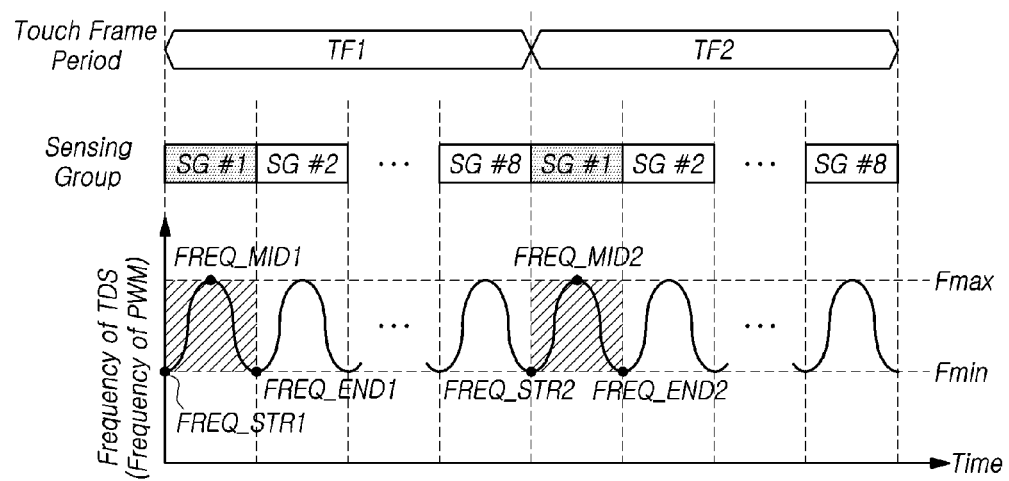
Figure 15I:
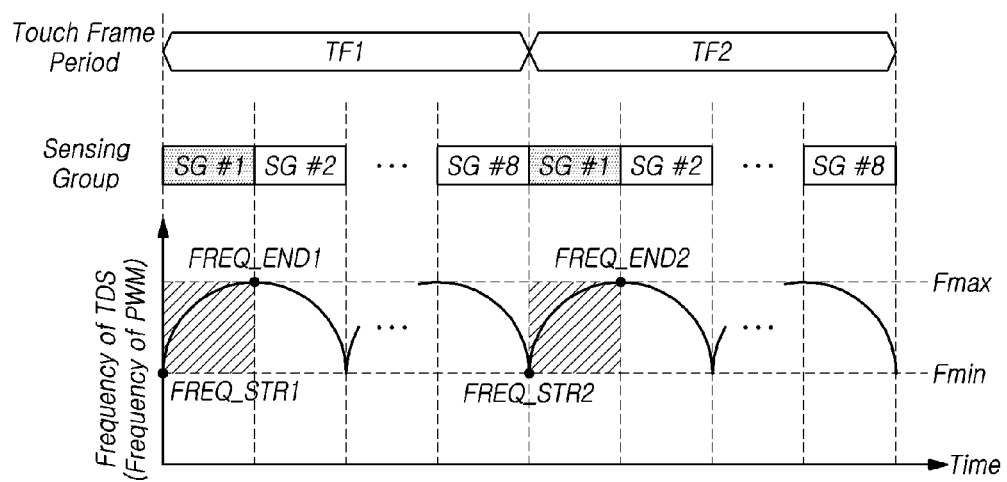

Referring to FIGS. 15A, 15F, and 15I, in each of the first touch frame period TF1 and the second touch frame period TF2, the frequency change patterns of the touch driving signal TDS and its reference signal PWM supplied to the first sensing group SG #1 may be increasing patterns.

Accordingly, the first frequency change end values PREQ_END1 may be greater than the first frequency change start values FREQ_STR1, and the second frequency change end values FREQ_END2 may be greater than the second frequency change start values FREQ_STR2.

Figure 15J:
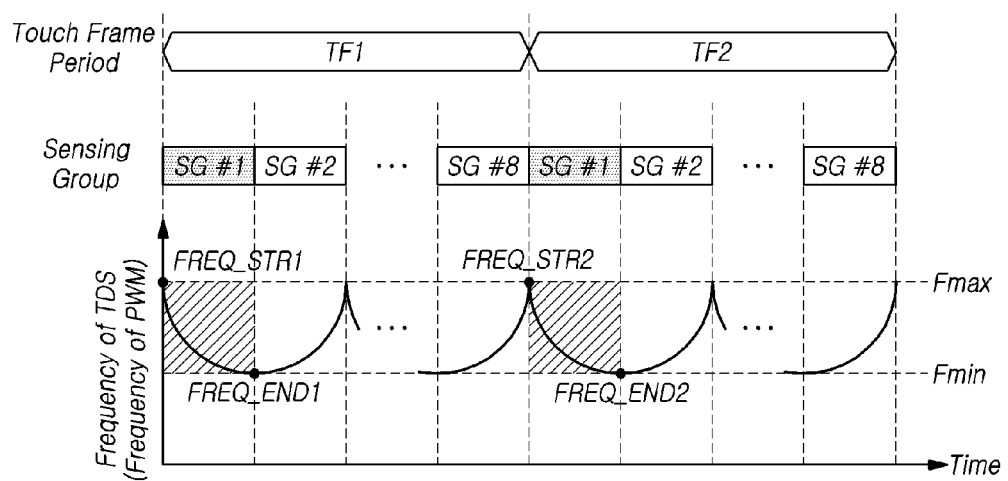

Referring to FIGS. 15B, 15E, and 15J, in each of the first touch frame period TF1 and the second touch frame period TF2, the frequency change patterns of the touch driving signal TDS and its reference signal PWM supplied to the first sensing group SG #1 may be decreasing patterns.

Accordingly, the first frequency change start values FREQ_STR1 may be greater than the first frequency change end values FREQ_END1, and the second frequency change start values FREQ_STR2 may be greater than the second frequency change end values FREQ_END2.

Figure 15K:
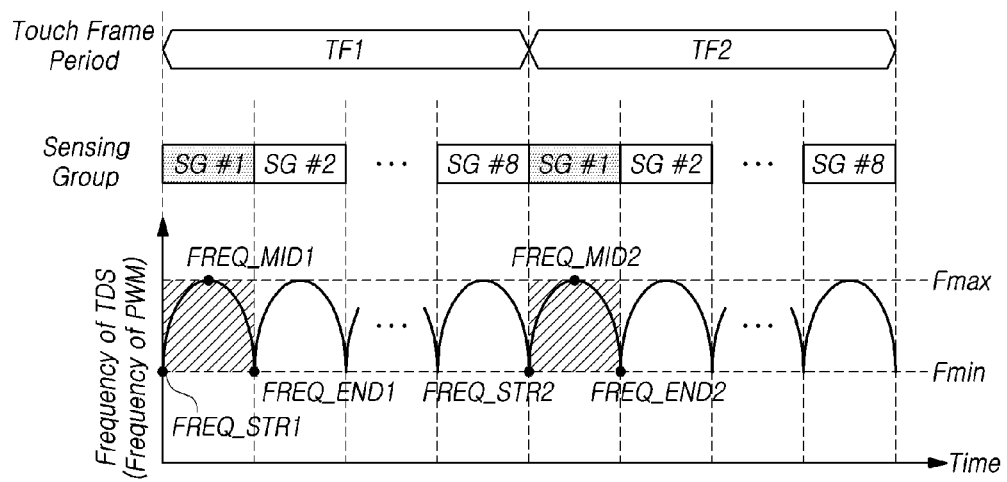

Referring to FIGS. 15C, 15H, and 15K, in each of the first touch frame period TF1 and the second touch frame period TF2, the frequency change patterns of the touch driving signal TDS and its reference signal PWM supplied to the first sensing group SG #1 may be patterns of increasing and then decreasing.

In these situations, during the first touch frame period TF1, the frequencies of the touch driving signal TDS supplied to the first touch electrode TE may be changed from the first frequency change start values FREQ_STR1 to first intermediate values FREQ_MID1 and then to the first frequency change end values FREQ_END1.

Further, during the second touch frame period TF2, the frequencies of the touch driving signal TDS supplied to the first touch electrode TE may be changed from the second frequency change start values FREQ_STR2 to second intermediate values FREQ_MID2 and then to the second frequency change end values FREQ_END2.

Referring to FIGS. 15C, 15H, and 15K, the first frequency change start values FREQ_STR1 and the first frequency change end values FREQ_END1 may be substantially equal, and first intermediate values FREQ_MID1 may be greater than the first frequency change start values FREQ_STR1 and the first frequency change end values FREQ_ENDE Further, the second frequency change start values FREQ_STR2 and the second frequency change end values FREQ_END2 may be substantially equal, and second intermediate values FREQ_MID2 may be greater than the second frequency change start values FREQ_STR2 and the second frequency change end values FREQ_END2.

Figure 15L:
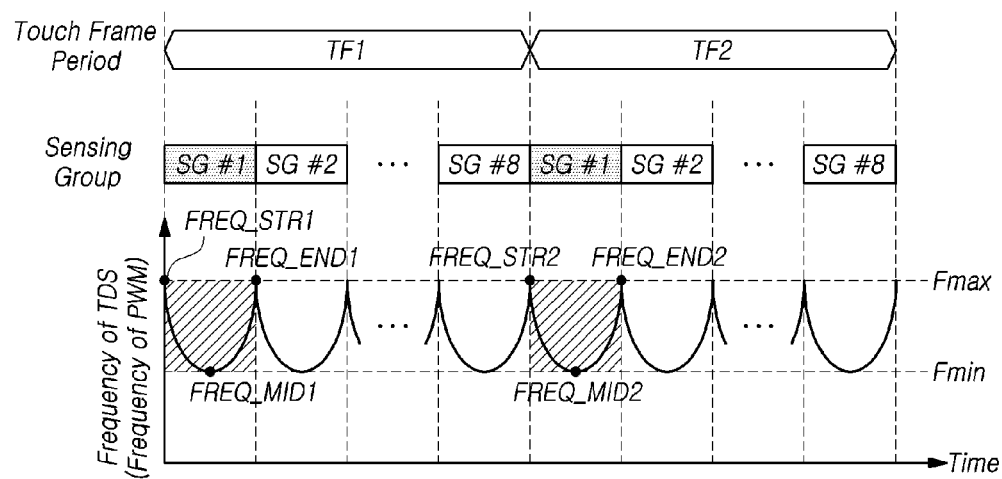

Referring to FIGS. 15D, 15G, and 15L, in each of the first touch frame period TF1 and the second touch frame period TF2, the frequency change patterns of the touch driving signal TDS and its reference signal PWM supplied to the first sensing group SG #1 may be patterns of decreasing and then increasing.

In these situations, during the first touch frame period TF1, the frequencies of the touch driving signal TDS supplied to the first touch electrode TE may be changed from the first frequency change start values FREQ_STR1 to first intermediate values FREQ_MID1 and then to the first frequency change end values FREQ_ENDE Further, during the second touch frame period TF2, the frequencies of the touch driving signal TDS supplied to the first touch electrode TE may be changed from the second frequency change start values FREQ_STR2 to second intermediate values FREQ_MID2 and then to the second frequency change end values FREQ_END2.

Referring to FIGS. 15D, 15G, and 15L, the first frequency change start values FREQ_STR1 and the first frequency change end values FREQ_END1 may be substantially equal, and first intermediate values FREQ_MID1 may be smaller than the first frequency change start values FREQ_STR1 and the first frequency change end values FREQ_ENDE Further, the second frequency change start values FREQ_STR2 and the second frequency change end values FREQ_END2 may be substantially equal, and second intermediate values FREQ_MID2 may be smaller than the second frequency change start values FREQ_STR2 and the second frequency change end values FREQ_END2.

Referring to FIGS. 15A to 15L, according to the frequency change patterns synchronized with touch driving timings, the amount of frequency change (a slope of a graph of the frequency versus time or a frequency change rate) per unit time of the touch driving signal TDS supplied to the first touch electrode TE included in the first sensing group SG #1 during the second touch frame period TF2 may be substantially equal to the amount of frequency change per unit time of the touch driving signal TDS supplied to the first touch electrode TE included in the first sensing group SG #1 during the first touch frame period TF1.

Referring to FIGS. 15A, 15B, 15C, and 15D, the frequency change patterns synchronized with touch driving timings may be a pattern in which the frequency increases or decreases in the form of a triangular wave.

In this situation, during the first touch frame period TF1, the amount of frequency change per unit time may be constant for a time when the frequency of the touch driving signal TDS supplied to the first touch electrode TE increases or decreases. During the second touch frame period TF2, the amount of frequency change per unit time may be constant for a time when the frequency of the touch driving signal TDS supplied to the first touch electrode TE increases or decreases.

Referring to FIGS. 15E, 15F, 15G, 15H, 15I, 15J, 15K, and 15L, the frequency change patterns synchronized with touch driving timings may be a pattern in which the frequency increases or decreases in the form of a sine wave or other curves.

In this situation, during the first touch frame period TF1, the amount of frequency change per unit time (a slope of a graph of the frequency versus time or a frequency change rate) may be variable for a time when the frequency of the touch driving signal TDS supplied to the first touch electrode TE increases or decreases. During the second touch frame period TF2, the amount of frequency change per unit time may be variable for a time when the frequency of the touch driving signal TDS supplied to the first touch electrode TE increases or decreases.

Referring to FIGS. 15A to 15L, when considering the first touch electrode TE and a second touch electrode TE included in the first sensing group SG #1, during the first touch frame period TF1, when a touch driving signal TDS is supplied to the first touch electrode TE, a frequency of the touch driving signal TDS supplied to the second touch electrode TE may be changed from first frequency change start values FREQ_STR1 up to first frequency change end values FREQ_END1. During the second touch frame period TF2, when the touch driving signal TDS is supplied to the first touch electrode TE, a frequency of the touch driving signal TDS supplied to the second touch electrode TE may be changed from second frequency change start values FREQ_STR2 up to second frequency change end values FREQ_END2.

Referring to FIGS. 15A, 15B, 15E, 15F, 15I, and 15J, the frequency change patterns of the touch driving signal TDS applied to the first touch electrode TE included in the first sensing group SG #1 and frequency change patterns of the touch driving signal TDS applied to the second touch electrode TE included in the second sensing group SG #2 may be different from each other.

Referring to FIGS. 15A, 15B, 15E, 15F, 15I, and 15J, when considering the first touch electrode TE included in the first sensing group SG #1 and the second touch electrode TE included in the second sensing group SG #2, the first touch frame period TF1 includes a first sensing period (a sensing period of SG #1) and a second sensing period (a sensing period of SG #2). In addition, the second touch frame period TF2 may include a first sensing period (a sensing period of SG #1) and a second sensing period (a sensing period of SG #2).

Referring to FIGS. 15A, 15B, 15E, 15F, 15I, and 15J, during the first sensing period (the sensing period of SG #1) within the first touch frame period TF1, the frequencies of the touch driving signal TDS supplied to the first touch electrode TE may be changed from first frequency change start values FREQ_STR1 to first frequency change end values FREQ_END1. Further, during the second sensing period (the sensing period of SG #2) within the first touch frame period TF1, the frequencies of the touch driving signal TDS supplied to the second touch electrode TE may be changed from first frequency change end values FREQ_END1 to first frequency change start values FREQ_STR1.

Referring to FIGS. 15A, 15B, 15E, 15F, 15I, and 15J, during the first sensing period (the sensing period of SG #1) within the second touch frame period TF2, the frequencies of the touch driving signal TDS supplied to the first touch electrode TE may be changed from second frequency change start values FREQ_STR2 to second frequency change end values FREQ_END2. Further, during the second sensing period (the sensing period of SG #2) within the second touch frame period TF2, the frequencies of the touch driving signal TDS supplied to the second touch electrode TE may be changed from second frequency change end values FREQ_END2 to second frequency change start values FREQ_STR2.

Referring to FIGS. 15C, 15D, 15G, 15H, 15K, and 15L, the frequency change patterns of the touch driving signal TDS applied to the first touch electrode TE included in the first sensing group SG #1 and frequency change patterns of the touch driving signal TDS applied to the second touch electrode TE included in the second sensing group SG #2 may be substantially equal.

Referring to FIGS. 15C, 15D, 15G, 15H, 15K, and 15L, during the first sensing period (the sensing period of SG #1) within the first touch frame period TF1, the frequencies of the touch driving signal TDS supplied to the first touch electrode TE may be changed from first frequency change start values FREQ_STR1 to first frequency change end values FREQ_END1. Further, during the second sensing period (the sensing period of SG #2) within the first touch frame period TF1, the frequencies of the touch driving signal TDS supplied to the second touch electrode TE may be changed from first frequency change start values FREQ_STR1 to first frequency change end values FREQ_ENDE The first frequency change start values FREQ_STR1 may be substantially equal to the first frequency change end values FREQ_ENDE Referring to FIGS. 15C, 15D, 15G, 15H, 15K, and 15L, during the first sensing period (the sensing period of SG #1) within the second touch frame period TF2, the frequencies of the touch driving signal TDS supplied to the first touch electrode TE may be changed from second frequency change start values FREQ_STR2 to second frequency change end values FREQ_END2. Further, during the second sensing period (the sensing period of SG #2) within the second touch frame period TF2, the frequencies of the touch driving signal TDS supplied to the second touch electrode TE may be changed from second frequency change start values FREQ_STR2 to second frequency change end values FREQ_END2. The second frequency change start values FREQ_STR2 may be substantially equal to the second frequency change end values FREQ_END2.

In the case of the frequency change patterns shown in FIGS. 15I and 15K, the frequencies may be mainly changed in a relatively high range. These frequency change patterns may be patterns advantageous to a situation where the EMI mainly occurs in the low frequency range.

In the case of the frequency change patterns shown in FIGS. 15J and 15L, the frequencies may be mainly changed in a relatively low range. These frequency change patterns may be patterns advantageous to a situation where the EMI mainly occurs in the high frequency range.

Figure 16:
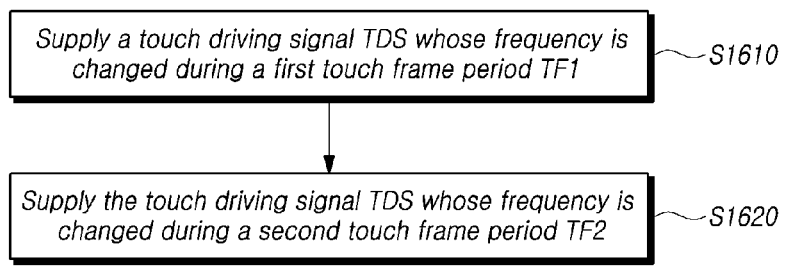
FIG. 16 is a flow diagram illustrating a method of driving the touch display device according to embodiments of the present disclosure.

FIG. 16 is a flow diagram illustrating a method of driving the touch display device 100 according to embodiments of the present disclosure.

Referring to FIG. 16, the method of driving the touch display device 100 according to embodiments of the present disclosure includes supplying a touch driving signal TDS whose frequency is changed over time by a touch driving circuit TDC to at least one of a plurality of touch electrodes TE during a first touch frame period TF1, at step S1610, supplying the touch driving signal TDS whose frequency is changed over time by the touch driving circuit TDC to the at least one of the plurality of touch electrodes TE during a second touch frame period TF2 different from the first touch frame period TF1, at step S1620, and the like.

In step S1610, during the first touch frame period TF1, a frequency of a touch driving signal TDS supplied to a first touch electrode TE of the plurality of touch electrodes TE may be changed from a first frequency change start value to a first frequency change end value.

In step S1620, during the second touch frame period TF2, a frequency of the touch driving signal TDS supplied to the first touch electrode TE of the plurality of touch electrodes TE may be changed from a second frequency change start value to a second frequency change end value. That is, during the second touch frame period TF2, the frequency of the touch driving signal TDS supplied to the first touch electrode TE may be changed in sync with a frequency change pattern of the touch driving signal TDS supplied to the first touch electrode TE during the first touch frame period TF1.

According to a frequency change characteristic of the touch driving signal TDS synchronized with a touch driving timing, a frequency change characteristic of the touch driving signal TDS in the first touch frame period TF1 and a frequency change characteristic of the touch driving signal TDS in the second touch frame period TF2 may be substantially equal.

That is, according to the frequency change characteristic of the touch driving signal TDS synchronized with the touch driving timing, the second frequency change start value may be substantially equal to the first frequency change start value, and the second frequency change end value may be substantially equal to the first frequency change end value.

The touch driving signal TDS may be generated based on a reference signal PWM, and a frequency changing pattern of the touch driving signal TDS may be substantially equal to a frequency changing pattern of the reference signal PWM. Thus, according to a frequency change characteristic of the reference signal PWM synchronized with a touch driving timing, the second frequency change start value may be substantially equal to the first frequency change start value, and the second frequency change end value may be substantially equal to the first frequency change end value.

According to the frequency change characteristic of the touch driving signal TDS synchronized with the touch driving timing, since the frequency change characteristic of the touch driving signal TDS in the first touch frame period TF1 and the frequency change characteristic of the touch driving signal TDS in the second touch frame period TF2 are substantially the same, the amount of frequency change per unit time of the touch driving signal TDS supplied to the first touch electrode TE during the second touch frame period TF2 may be the same as the amount of frequency change per unit time of the touch driving signal TDS supplied to the first touch electrode TE during the first touch frame period TF1.

According to the frequency change characteristic of the touch driving signal TDS synchronized with the touch driving timing, since the frequency change characteristic of the touch driving signal TDS in the first touch frame period TF1 and the frequency change characteristic of the touch driving signal TDS in the second touch frame period TF2 are substantially equal, during the first touch frame period TF1, when the amount of frequency change per unit time is constant for a time when the frequency of the touch driving signal TDS supplied to the first touch electrode TE increases or decreases, during the second touch frame period TF2, the amount of frequency change per unit time may be constant for a time when the frequency of the touch driving signal TDS supplied to the first touch electrode TE increases or decreases.

According to the frequency change characteristic of the touch driving signal TDS synchronized with the touch driving timing, since the frequency change characteristic of the touch driving signal TDS in the first touch frame period TF1 and the frequency change characteristic of the touch driving signal TDS in the second touch frame period TF2 are substantially equal, during the first touch frame period TF1, when the amount of frequency change per unit time is variable for a time when the frequency of the touch driving signal TDS supplied to the first touch electrode TE increases or decreases, during the second touch frame period TF2, the amount of frequency change per unit time may be variable for a time when the frequency of the touch driving signal TDS supplied to the first touch electrode TE increases or decreases.

The above description has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present invention. The above description and the accompanying drawings provide an example of the technical idea of the present invention for illustrative purposes only. That is, the disclosed embodiments are intended to illustrate the scope of the technical idea of the present invention. Thus, the scope of the present invention is not limited to the embodiments shown, but is to be accorded the widest scope consistent with the claims. The scope of protection of the present invention should be construed based on the following claims, and all technical ideas within the scope of equivalents thereof should be construed as being included within the scope of the present invention.

What is claimed is:

1. A touch display device comprising:
   a plurality of touch electrodes; and
   a touch driving circuit configured to supply a touch driving signal to at least one of the plurality of touch electrodes during a touch driving period of a display frame period that includes the touch driving period, the touch driving period including a first touch frame period and a second touch frame period that is subsequent the first touch frame period, the touch driving signal having a frequency that is changed over time,
   wherein during the first touch frame period, a frequency of the touch driving signal supplied to a first touch electrode of the plurality of touch electrodes is changed a first plurality of times between changing from a first frequency change start value at a start of the first touch frame period to a first frequency change end value at an end of the first touch frame period, and
   during the second touch frame period that is different from the first touch frame period, the frequency of the touch driving signal supplied to the first touch electrode is changed a second plurality of times between changing from a second frequency change start value at a start of the second touch frame period to a second frequency change end value at an end of the second touch frame period, and
   wherein the second frequency change start value is equal to the first frequency change start value, and
   wherein the second frequency change end value is equal to the first frequency change end value.

2. The touch display device according to claim 1, wherein the first frequency change end value is greater than the first frequency change start value, and the second frequency change end value is greater than the second frequency change start value.

3. The touch display device according to claim 1, wherein the first frequency change start value is greater than the first frequency change end value, and the second frequency change start value is greater than the second frequency change end value.

4. The touch display device according to claim 1, wherein during the first touch frame period, the frequency of the touch driving signal supplied to the first touch electrode is changed from the first frequency change start value to a first intermediate value and then to the first frequency change end value, and during the second touch frame period, the frequency of the touch driving signal supplied to the first touch electrode is changed from the second frequency change start value to a second intermediate value and then to the second frequency change end value, wherein the first frequency change start value and the first frequency change end value are equal, and the first intermediate value is greater than the first frequency change start value and the first frequency change end value, and wherein the second frequency change start value and the second frequency change end value are equal, and the second intermediate value is greater than the second frequency change start value and the second frequency change end value.

5. The touch display device according to claim 1, wherein during the first touch frame period, the frequency of the touch driving signal supplied to the first touch electrode is changed from the first frequency change start value to a first intermediate value and then to the first frequency change end value, and during the second touch frame period, the frequency of the touch driving signal supplied to the first touch electrode is changed from the second frequency change start value to a second intermediate value and then to the second frequency change end value, wherein the first frequency change start value and the first frequency change end value are equal, and the first intermediate value is less than the first frequency change start value and the first frequency change end value, and wherein the second frequency change start value and the second frequency change end value are equal, and the second intermediate value is less than the second frequency change start value and the second frequency change end value.

6. The touch display device according to claim 1, wherein an amount of frequency change per unit time of the touch driving signal supplied to the first touch electrode during the second touch frame period is equal to an amount of frequency change per unit time of the touch driving signal supplied to the first touch electrode during the first touch frame period.

7. The touch display device according to claim 6, wherein during the first touch frame period, the amount of frequency change per unit time is constant for a time in which the frequency of the touch driving signal supplied to the first touch electrode increases or decreases, and during the second touch frame period, the amount of frequency change per unit time is constant for a time in which the frequency of the touch driving signal supplied to the first touch electrode increases or decreases.

8. The touch display device according to claim 6, wherein during the first touch frame period, the amount of frequency change per unit time is variable for a time in which the frequency of the touch driving signal supplied to the first touch electrode increases or decreases, and during the second touch frame period, the amount of frequency change per unit time is variable for a time in which the frequency of the touch driving signal supplied to the first touch electrode increases or decreases.

9. The touch display device according to claim 1, wherein the plurality of touch electrodes includes a second touch electrode different from the first touch electrode, and wherein during the first touch frame period, when the touch driving signal is supplied to the first touch electrode, a frequency of the touch driving signal supplied to the second touch electrode is changed from the first frequency change start value to the first frequency change end value, and during the second touch frame period, when the touch driving signal is supplied to the first touch electrode, the frequency of the touch driving signal supplied to the second touch electrode is changed from the second frequency change start value to the second frequency change end value.

10. The touch display device according to claim 1, wherein the plurality of touch electrodes includes a second touch electrode different from the first touch electrode, wherein the first touch frame period includes a first sensing period and a second sensing period, and the second touch frame period includes a first sensing period and a second sensing period, wherein during the first sensing period in the first touch frame period, the frequency of the touch driving signal supplied to the first touch electrode is changed from the first frequency change start value to the first frequency change end value, and during the second sensing period in the first touch frame period, a frequency of the touch driving signal supplied to the second touch electrode is changed from the first frequency change end value to the first frequency change start value, and wherein during the first sensing period in the second touch frame period, the frequency of the touch driving signal supplied to the first touch electrode is changed from the second frequency change start value to the second frequency change end value, and during the second sensing period in the second touch frame period, the frequency of the touch driving signal supplied to the second touch electrode is changed from the second frequency change end value to the second frequency change start value.

11. The touch display device according to claim 1, wherein the plurality of touch electrodes includes a second touch electrode different from the first touch electrode, wherein the first touch frame period includes a first sensing period and a second sensing period, and the second touch frame period includes a first sensing period and a second sensing period, wherein during the first sensing period in the first touch frame period, the frequency of the touch driving signal supplied to the first touch electrode is changed from the first frequency change start value to the first frequency change end value, wherein during the second sensing period in the first touch frame period, a frequency of the touch driving signal supplied to the second touch electrode is changed from the first frequency change start value to the first frequency change end value, and wherein during the first sensing period in the second touch frame period, the frequency of the touch driving signal supplied to the first touch electrode is changed from the second frequency change start value to the second frequency change end value, and during the second sensing period in the second touch frame period, the frequency of the touch driving signal supplied to the second touch electrode is changed from the second frequency change start value to the second frequency change end value.

12. The touch display device according to claim 1, further comprising a touch controller configured to supply a reference signal and receive sensing data from the touch driving circuit,
    wherein the touch driving signal is generated based on the reference signal, and a frequency change pattern of the touch driving signal is equal to a frequency change pattern of the reference signal.

13. The touch display device according to claim 1, wherein the touch driving signal includes an active pulse period in which a frequency is changed, and at least one dummy pulse period locating prior to the active pulse period.

14. A method of driving a touch display device, the method comprising:
    supplying a touch driving signal to at least one of a plurality of touch electrodes during a touch driving period of a display frame period that includes the touch driving period, the touch driving period including a first touch frame period and a second touch frame period that is subsequent the first touch frame period, the touch driving signal having a frequency that is changed over time during the first touch frame period; and
    supplying the touch driving signal whose frequency is changed over time to the at least one of the plurality of touch electrodes during the second touch frame period different from the first touch frame period,
    wherein during the first touch frame period, the frequency of the touch driving signal supplied to a first touch electrode of the plurality of touch electrodes is changed a first plurality of times between changing from a first frequency change start value at a start of the first touch frame period to a first frequency change end value at an end of the first touch frame period, and during the second touch frame period, the frequency of the touch driving signal supplied to the first touch electrode is changed a second plurality of times at a start of the second touch frame period to an end of the second touch frame period such that the frequency of the touch driving signal during the second touch frame period is in sync with a frequency change pattern of the touch driving signal supplied to the first touch electrode during the first touch frame period.

15. The method according to claim 14, wherein the touch driving signal is generated based on a reference signal, and a frequency change pattern of the touch driving signal is equal to a frequency change pattern of the reference signal.

16. The method according to claim 14, wherein an amount of frequency change per unit time of the touch driving signal supplied to the first touch electrode during the second touch frame period is equal to an amount of frequency change per unit time of the touch driving signal supplied to the first touch electrode during the first touch frame period.

17. The method according to claim 16, wherein during the first touch frame period, the amount of frequency change per unit time is constant for a time in which the frequency of the touch driving signal supplied to the first touch electrode increases or decreases, and during the second touch frame period, the amount of frequency change per unit time is constant for a time in which the frequency of the touch driving signal supplied to the first touch electrode increases or decreases.

18. The method according to claim 16, wherein during the first touch frame period, the amount of frequency change per unit time is variable for a time in which the frequency of the touch driving signal supplied to the first touch electrode increases or decreases, and during the second touch frame period, the amount of frequency change per unit time is variable for a time in which the frequency of the touch driving signal supplied to the first touch electrode increases or decreases.

19. A touch driving circuit comprising:
    an operational amplifier including a first input terminal to which a touch driving signal is input during a touch driving period of a display frame period that includes the touch driving period, a second input terminal electrically connected to a touch electrode, and an output terminal from which an output signal is output, wherein the touch driving period includes a first touch frame period and a second touch frame period that is subsequent the first touch frame period; and
    a capacitor connected between the first second input terminal and the output terminal of the operational amplifier,
    wherein a frequency of the touch driving signal is changed over time, and
    wherein during the first touch frame period, the frequency of the touch driving signal supplied to the touch electrode is changed a first plurality of times between changing from a first frequency change start value at a start of the first touch frame period to a first frequency change end value at an end of the first touch frame period, and during the second touch frame period that is different from the first touch frame period, the frequency of the touch driving signal supplied to the touch electrode is changed a second plurality of times at a start of the second touch frame period to an end of the second touch frame period such that the frequency of the touch driving signal during the second touch frame period is in sync with a frequency change pattern of the touch driving signal supplied to the touch electrode during the first touch frame period.

20. A touch controller comprising:
    a signal generator configured to generate a reference signal based on a touch synchronization signal and outputting the generated reference signal; and
    a processor configured to receive sensing data and output touch location information,
    wherein the touch synchronization signal includes a first level voltage period representing a touch driving period of a display frame period that includes the touch driving period and a second level voltage period representing a non-touch driving period included in the display frame period, the touch driving period including a first touch frame period and a second touch frame period that is subsequent the first touch frame period,
    wherein one or more first level voltage periods included in the touch synchronization signal correspond to one touch frame period,
    wherein a frequency of the reference signal is changed over time, and
    wherein during the first touch frame period, the frequency of the reference signal is changed a first plurality of times between changing from a first frequency change start value at a start of the first touch frame period to a first frequency change end value at an end of the first touch frame period, and during the second touch frame period that is different from the first touch frame period, the frequency of the reference signal is changed a second plurality of times at a start of the second touch frame period to an end of the second touch frame period such that the frequency of the touch driving signal during the second touch frame period is in sync with a frequency change pattern of the reference signal during the first touch frame period.

\* \* \* \* \*